United States Patent
Netsu et al.

(10) Patent No.: US 7,582,221 B2
(45) Date of Patent: Sep. 1, 2009

(54) WAFER MANUFACTURING METHOD, POLISHING APPARATUS, AND WAFER

(75) Inventors: Shigeyoshi Netsu, Fukushima (JP); Hisashi Masumura, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/181,829

(22) PCT Filed: Oct. 22, 2001

(86) PCT No.: PCT/JP01/09240

§ 371 (c)(1),
(2), (4) Date: Jul. 23, 2002

(87) PCT Pub. No.: WO02/35593

PCT Pub. Date: May 2, 2002

(65) Prior Publication Data

US 2003/0022495 A1 Jan. 30, 2003

(30) Foreign Application Priority Data

Oct. 26, 2000 (JP) .............................. 2000-326470

(51) Int. Cl.
C03C 15/00 (2006.01)
H01L 21/302 (2006.01)

(52) U.S. Cl. .............................. 216/88; 216/53; 216/99; 438/690; 438/691; 438/692

(58) Field of Classification Search .................. 216/88, 216/89, 53, 99; 438/692, 693, 690, 691, 438/750, 753; 156/345.12, 345.23
See application file for complete search history.

(56) References Cited

U.S. PATENT DOCUMENTS

| | | | |
|---|---|---|---|
| 5,429,711 A * | 7/1995 | Watanabe et al. ............. 216/52 |
| 5,494,862 A * | 2/1996 | Kato et al. .................. 438/693 |
| 5,821,167 A * | 10/1998 | Fukami et al. .............. 438/691 |
| 5,827,167 A * | 10/1998 | Dougan et al. .............. 473/365 |
| 5,827,779 A * | 10/1998 | Masumura et al. .......... 438/691 |
| 5,981,392 A * | 11/1999 | Oishi ......................... 438/691 |
| 6,217,417 B1 * | 4/2001 | Nakamura et al. ............ 451/41 |
| 6,352,927 B2 * | 3/2002 | Kishimoto .................. 438/690 |
| 6,491,836 B1 * | 12/2002 | Kato et al. .................... 216/88 |
| 2001/0039101 A1* | 11/2001 | Wenski ....................... 438/471 |

FOREIGN PATENT DOCUMENTS

| | | |
|---|---|---|
| DE | 198 23 904 A1 | 12/1999 |
| EP | 1 049 145 A1 | 11/2000 |
| EP | 1 146 551 A1 | 10/2001 |
| JP | 63-076413 * | 4/1988 |
| JP | 03-173129 * | 7/1991 |

(Continued)

OTHER PUBLICATIONS

Supplementary European Search Report dated Dec. 3, 2004.
International Patent Search dated Jan. 22, 2002.

*Primary Examiner*—George A. Goudreau
(74) *Attorney, Agent, or Firm*—Rader, Fishman & Grauer PLLC

(57) ABSTRACT

The present invention provides a wafer manufacturing method and a wafer polishing apparatus which enable control of sags in a periphery of a wafer and improvement of nano-topology values thereof that is strongly required recently, and a wafer. In a polishing process for making a mirror surface of the wafer, a back surface of the wafer is polished to produce a reference plane thereof.

9 Claims, 15 Drawing Sheets

FOREIGN PATENT DOCUMENTS

| | | | |
|---|---|---|---|
| JP | 10-55990 | | 2/1996 |
| JP | 08-195366 | * | 7/1996 |
| JP | 10-055990 | * | 2/1998 |
| JP | 11-111653 | | 4/1999 |
| JP | 2000-012411 | * | 1/2000 |
| JP | 2000-124173 | | 4/2000 |
| JP | 2000-288912 | | 10/2000 |
| JP | 2001-113458 | | 4/2001 |
| JP | 2001-203177 | * | 7/2001 |
| JP | 2001-328063 | | 11/2001 |

* cited by examiner

WAFER MANUFACTURING METHOD, POLISHING APPARATUS, AND WAFER

TECHNICAL FIELD

The present invention relates to a wafer manufacturing method, a polishing apparatus, and a wafer, more particularly to a wafer manufacturing method and a polishing apparatus which prevent peripheral sags of a mirror polished wafer so that the wafer can be polished up to its peripheral edge at a high flatness level, and a wafer.

BACKGROUND ART

Generally a silicon wafer manufacturing method comprises, as shown in FIG. 18(a), a slicing step 100 of slicing a single crystal ingot to obtain a thin disk-shaped wafer; a chamfering step 102 of chamfering a peripheral edge portion of the wafer obtained through the slicing step 100 to prevent cracking and chipping of the wafer; a lapping step 104 of flattening this wafer; an etching step 106 of removing processing deformation remaining in the so chamfered and lapped wafer; a polishing step 108 of making a mirror surface of the wafer; and a cleaning step 110 of cleaning the polished wafer to remove a polishing agent or dust particles deposited thereon. The main steps are only listed above, and sometimes other steps such as a heat treatment step and a surface grinding step may be added, or the step sequence may be changed.

The polishing step 108 of making a mirror surface of the wafer is further classified into sub-steps, and various types of polishing methods and polishing apparatus are used in each of the sub-steps. As a wafer single side polishing apparatus 200 used in the polishing process, for instance, as shown in FIG. 14, there has been widely known a polishing apparatus comprising a disk-shaped turn table 206 which is rotated by a rotary shaft 204 and has a polishing cloth 202 adhered on the upper surface thereof, a wafer holding head (polishing head) 208 for holding one surface of a wafer (W) to be polished and contacting another surface of the wafer (W) to the polishing cloth 202, and a head driving mechanism 210 for operating relative rotation of the wafer holding head 208 against the turn table 206, wherein the wafer is polished by supplying slurry 214 containing abrasive grains from a slurry supplying unit 212 between the polishing cloth 202 and the wafer (W).

As another type of polishing, as shown in FIG. 15, there is a method of simultaneously polishing both the front and back surfaces of a wafer. This double side polishing apparatus 220 has a lower polishing turn table 222 and an upper polishing turn table 224 which are faced each other vertically. A lower polishing cloth 226 is adhered on the upper surface of the lower polishing turn table 222, and an upper polishing cloth 228 is adhered on the lower surface of the upper polishing turn table 224.

A disk-shaped carrier 230 is supported between the upper surface of the lower polishing cloth 226 of the lower polishing turn table 222 and the lower surface of the upper polishing cloth 228 of the upper polishing turn table 224 and rotates and revolves slidably between the lower polishing cloth 226 and the upper polishing cloth 228. The carrier 230 has a plurality of wafer holes 232.

Wafers (W) to be polished are set in the wafer holes 232. When the wafers (W) are polished, a polishing agent is supplied between the wafers (W) and the polishing cloths 226, 228 via throughholes (not shown) formed in the upper polishing turn table 224 from nozzles (not shown). As the carrier 230 rotates and revolves, the wafers (W) rotate and revolve slidably between the lower polishing cloth 226 and the upper polishing cloth 228, thereby both the surfaces of the wafers (W) being polished.

There are also various methods of holding a wafer. For instance, there are a batch holding method in which a plurality of wafers are adhered on one and the same plate using wax or the like and are polished, and a single wafer holding method in which wafers are held one by one by means of wax or vacuum chucking and are polished.

The wafer holding method employed when polishing a wafer is divided broadly into two systems, that is, a wax mounting system and a waxless system. The waxless system comprises a vacuum chucking system, a template system, and the like.

Of these systems, as shown in FIG. 17, a wafer holding head 240 according to the template system has such a structure as, when polishing a wafer (W), the wafer (W) is fitted in an engagement hole 244 in a template blank of the template 242, and the back surface of the wafer (W) is held by a backing pad 250 adhered to a lower surface of the upper polishing turn table 248 attached to a lower end of a head 246.

When polishing wafers (W) with the holding head 240, wafers to be polished are fitted into each of the engagement holes 244 in the template blank of the template 242, respectively, and the thus situated template 242 is arranged on a lower polishing turn table (not shown) so that the wafers (W) are in lower positions. In this state, one surface of the wafer (W) contacts a polishing cloth adhered on the lower polishing turn table (not shown). In this state, when a back pressure is applied to the template 242 by the upper polishing turn table 248 and at the same time the lower polishing plate (not shown) is rotated, the template 242 rotates at the place together with the lower polishing plate and the wafer (W) is polished.

Thus there is known a holding method named a waxless system in which, without using vacuum chucking or adhesion by wax, a soft material named a backing pad is used for holding a wafer. Also there is a polishing method named CMP (Chemical and Mechanical Polishing) in which a wafer is polished in such a manner as the wafer is held by a soft backing pad not to transfer a vacuum chucking side configuration of the wafer to a front surface thereof.

With a combination of various types of polishing apparatus described above, a wafer is mirror polished by multistage polishing including primary polishing, secondary polishing, final polishing, and the like.

Currently, the wax mounting system is often used in the above mentioned polishing systems, but in view of deterioration of a flatness level due to variations in an adhesive layer, cleaning of the wax, and so forth, for instance, polishing of the waxless system, double side polishing or the like have also been employed. For instance, as shown in FIG. 18(b), a waxless polishing step 108A shows a case in which polishing of the waxless system is performed in all of a primary polishing step (A1), a secondary polishing step (A2), and a final polishing step (A3), while a double side polishing step 108B shows a case in which double side polishing is performed in a primary polishing step (B1) and polishing of other systems are employed in a secondary polishing step (B2) and a final polishing step (B3).

The primary polishing step (A1), (B1) is for the main purpose of flattening and making a mirror surface, and is a step of polishing a wafer with the stock removal of 10 μm or more. A relatively hard polishing cloth may be used for correcting a wafer configuration (so-called correction polishing). Recently, before a polishing step, a flatness level of a wafer is improved by, for instance, an etching step, a lapping step prior to the etching step, or a surface grinding step, and with keeping this improved configuration, making a mirror surface (so-called copy polishing) may be performed. The combination of correction polishing and copy polishing may improve a flatness level of a wafer and make a mirror surface thereof.

The secondary polishing step (A2), (B2) is for the main purpose of making a mirror surface of the portion which has not been improved in the primary polishing step (A1), (B1), and in the secondary polishing step, there is mainly performed so-called copy polishing wherein a wafer is polished with keeping a wafer configuration by removing a certain thickness with the stock removal of several μm. In this stage, there are some cases where a configuration of a peripheral portion of a wafer is corrected.

The final polishing step (A3), (B3) is for the purpose of improving haze, and the stock removal is of a very small amount.

In order to improve a flatness level more by removing tapers and the like of a wafer, it is effective to polish the wafer while rotating it during the polishing operation, and the waxless polishing or the double side (simultaneous) polishing is preferable. Therefore, these systems of polishing may be performed in the primary polishing step and so on.

When a wafer is polished by the conventional waxless polishing or double side (simultaneous) polishing, although tapers are improved, a number of peripheral sags are generated. Further while the wafer is polished in multiple polishing stages, rises and the like are generated to form inflection points on a wafer surface, especially in peripheral portions thereof, and make irregularities in a minute area (may be termed nanotopology) or flatness thereof worse.

The peripheral sags described above are due to a phenomenon wherein the periphery of the wafer is polished excessively and becomes thinner than the central portion thereof in terms of thickness. This phenomenon easily occurs when polishing a wafer by a general method.

The rises are due to a phenomenon wherein the periphery of the wafer is not polished and becomes thicker than the central portion. This phenomenon seldom occurs usually, but often occurs when a wafer is polished with a polishing head using a retainer ring in CMP and the like.

The rises may also be generated when the polishing rate is intentionally slowed down in the wafer periphery by, for instance, making the polishing pressure lower only in the periphery than in the central portion to improve the flatness level in the primary or secondary polishing step (on the assumption that peripheral sags are generated).

The inflection points are formed when a wafer having the peripheral sags is polished in the above described manner that the rises are generated. The presence of the inflection points makes the value termed nanotopology worse.

The nanotopology (may be also termed nanotopography) is one of surface evaluation wherein a wafer surface is divided into a plurality of areas and a variation in undulations (peak to valley: PV value) for each of the areas is evaluated. The evaluation is carried out as to whether what percentage of the wafer surface is occupied by the areas having the specified variation in undulations (PV value) or what extent is the maximum PV value among the PV values for all the evaluated areas.

The flatness is based on a back side reference, a front side reference, etc., and expressed, for instance, as SBIR or SFQR. Here, the SBIR (Site Back side Ideal Range) is defined as a difference in the distance between the highest position and the lowest position from a vacuum chucking face which vacuum chucks and fixes a wafer, when assuming the chucking face as a fixed reference for flatness and evaluating each site (each area obtained by dividing the entire surface of a wafer into respective prescribed areas).

On the other hand, the SFQR (Site Front least-sQuares Range) is a value expressing a maximum range of irregularities against an average plane of a front side reference in terms of flatness, the average plane being calculated for each site. As to the wafer flatness, it is necessary to improve the SFQR and nanotopology of the front side reference.

When a wafer is subjected to the double side polishing only, although an inflection point is not formed, sags are easily generated in the periphery of the wafer. Especially, the sags are generated on both surfaces of the wafer, and hence there is a big effect thereof. Although the sags can be made smaller by reducing a stock removal in the double side polishing step, in order to make a mirror surface a larger stock removal is required in the subsequent secondary polishing step, and large sags are generated after all. Also when a wafer is subjected to polishing of the waxless system, sags are easily generated in the periphery of the wafer as in the case of double side polishing, and the flatness level is not sufficient.

DISCLOSURE OF THE INVENTION

It is an object of the present invention to provide a wafer manufacturing method and a polishing apparatus which enable control of sags in the periphery of the wafer that is the most difficult problem in the polishing techniques and improvement of nanotopology values thereof that is especially required in recent years, and also to provide wafers having the improved quality described above.

To solve the problem described above, the wafer manufacturing method according to the present invention comprises the step of performing back side polishing of the wafer to produce a reference plane thereof in a polishing process for making a mirror surface of the wafer.

The reference plane of the wafer is a plane which can be obtained by vacuum chucking a warped wafer or the like onto a flat wafer holding plate to make forcibly the wafer flat and polishing the wafer in the flat state.

Preferably, a multistage polishing process in which a wafer is polished in multiple stages is employed as the polishing process, and the back side polishing is performed after a primary polishing step in the multistage polishing process.

In the multistage polishing process, the wafer is preferably polished in the sequence of double side (simultaneous) polishing, back side (single side) polishing, front side (single side) secondary polishing, and front side (single side) final polishing. Thus after the double side simultaneous polishing (primary polishing step), there is preferably introduced a step in which a wafer is vacuum chucked onto a flat wafer holding plate to make forcibly the wafer flat and the back surface thereof is polished.

The wafer which has been double side polished in the double side simultaneous polishing step is excellent in tapers, but has a problem that sags are easily generated in its periphery; therefore in the double side polishing step the wafer is preferably polished with the stock removal of the order of 5 μm to 20 μm for the both surfaces thereof. Further in the multistage polishing step the wafer is preferably polished in the sequence of front side (single side) primary polishing based on the front side reference polishing system, back side (single side) polishing, front side (single side) secondary polishing, and front side (single side) final polishing. Thus after the front side polishing (the primary polishing step) based on the front side reference polishing system, there is preferably introduced a step in which a wafer is vacuum chucked onto a flat wafer holding plate to make forcibly the wafer flat and the back surface thereof is polished. This is because the wafer which has been polished according to the front side reference polishing system is excellent in nanotopology, but as in the double side polishing sags are easily generated in its periphery.

As an example of the polishing based on the front side reference polishing system, there is waxless polishing based on the template system or the like, and in this case it is preferable to employ such a polishing system as a wafer is held by a wafer holding portion of a soft elastic film such as a backing pad or a soft film. This polishing system can make the front side reference polishing possible.

Next, in the back side polishing newly introduced according to the present invention, the wafer is preferably polished using a flat wafer holding plate with a high hardness which holds the wafer by means of vacuum chucking or the like. In this case, the wafer is preferably polished in a manner that vacuum chucking marks are not transferred to the wafer. For this end, the wafer should be held in a manner that throughholes for vacuum chucking are made smaller, or a vacuum chucking pressure is set as low as possible. With this polishing manner, the flatness of one surface of the polished wafer is improved so as to produce a reference plane. The stock removal in this polishing is in the range of the order of 3 to 10 μm. With this polishing manner, the flatness of the polished wafer becomes excellent up to its periphery.

It is also possible to produce a reference plane by polishing a front surface of the wafer, but in the present invention a reference plane is produced by polishing a back surface thereof. That is, in the present invention, it is indispensable to produce a reference plane of a wafer by polishing a back surface of the wafer.

This is because if the front surface is further polished after double side polishing or waxless polishing, sags are further generated in its periphery, and depending on the type of a polishing head (a wafer holding method), vacuum chucking marks may be formed on the polished surface, so that the flatness and nanotopology of the wafer are deteriorated.

This is also because in order to improve the nanotopology of a front side reference, it is necessary to prevent the deterioration as described above, and to adjust the flatness or peripheral sags on the back surface independent of the nanotopology of the front surface.

Although there is a technique performing the back side polishing after the double side polishing among the prior arts, this is not for producing a reference plane, but for the case where the (back side) polishing is performed for intentionally making the surface roughness of a wafer rougher to clearly discriminate between the front surface and the back surface after the double side polishing. In the present invention, the polishing after the double side polishing is not performed for making the back surface rougher, but for making the back surface mirror polished still in this stage to improve flatness and other surface states.

It is especially preferable to perform the back side polishing after the primary polishing. The primary polishing is performed with a double side polishing apparatus to remove tapers, or by waxless polishing based on the front side reference polishing system to improve flatness of the entire wafer. After that, the back surface is polished to produce a reference plane, and then the front surface is subjected to the secondary polishing and final polishing to manufacture a wafer with no inflection point in its periphery. Now, note that the primary polishing, secondary polishing, and final (tertiary) polishing are expressed by the number of polishing times of a front surface of a wafer.

By introduction of the back side polishing step, flatness of the entire wafer (indirectly flatness of a front surface thereof) is improved. To be more precise, by vacuum chucking and polishing the front surface, when the vacuum chucking is released, the flatness and peripheral sags of the front surface are improved without polishing the front surface.

A feature of the wafer manufacturing method according to the present invention resides in the point that the wafer is not vacuum chucked (fixed) when a front surface thereof is polished and the wafer is fixed when a back surface thereof is polished. There is no specific limitation on the fixing method of the wafer when the back surface thereof is polished, but the wafer is fixed onto a flat wafer holding plate with adhesion by wax or vacuum chucking to make forcibly the fixed side surface of the wafer flat, a back surface of the wafer being polished. To be more precise, when the front surface of the wafer is polished, the waxless polishing system based on the front side reference polishing system or the like is employed, and when the back surface of the wafer is polished, the back side reference polishing system is employed in which the wafer is held on a work holding plate having a reference plane. Especially, in that case, polishing is performed in the sequence of the front side polishing, back side polishing, and the front side polishing. The front side polishing makes quality of nanotopology completed, and the back side polishing makes quality of flatness completed. For the front side polishing after the back side polishing, the secondary polishing and final polishing should be performed, but the same effect can be expected even when only the final polishing is performed, or when additional polishing stages are employed in addition to the above described polishing steps. It should be noted that either the front side reference polishing system or the back side reference polishing system may be employed for polishing with a small amount of stock removal such as final polishing.

A first aspect of the polishing apparatus according to the present invention comprises: a first polishing section for performing primary polishing of a front surface of a wafer based on the front side reference polishing system; a first inverting unit for turning the wafer polished in the first polishing section upside down; a second polishing section for polishing a back surface of the wafer in the state where the wafer polished in the first polishing section is vacuum chucked onto a flat wafer holding plate to make forcibly the wafer flat; a second inverting unit for turning the wafer polished in the second polishing section upside down; a third polishing section for performing secondary polishing of the front surface of the wafer based on the waxless system; and a fourth polishing section for performing final polishing of the front surface of the wafer based on the waxless system.

A second aspect of the polishing apparatus according to the present invention including at least three polishing sections comprises: a first polishing section for polishing a front surface of a wafer without vacuum chucking a back surface of the wafer; a first inverting unit for turning the wafer polished in the first polishing section upside down; a second polishing section for polishing the back surface of the wafer in the state where the wafer polished in the first polishing section is vacuum chucked onto a flat wafer holding plate to make forcibly the wafer flat; a second inverting unit for turning the wafer polished in the second polishing section upside down; a third polishing section for polishing the front surface of the wafer without vacuum chucking the back surface of the wafer.

The wafer according to the present invention has both mirror polished surfaces, wherein one main surface of the wafer has a configuration that an SFQRmax is 0.10 μm or less and there is no inflection point in a center side of 2 mm from the peripheral edge of the wafer. The inflection point is a point at which a configuration of the surface changes from a convex state to a concave state or from a concave state to a convex state, that is, a part at which a sign of the differential coefficient changes from plus to minus or from minus to plus. The wafer of the present invention is characterized in that there is no abrupt change in this curvature. Especially the wafer has no large change in irregularities of 0.02 μm or more. In the wafer according to the present invention, it is preferable that a front surface of the wafer is divided into a plurality of 2 mm×2 mm square areas, a PV value of each of the areas is evaluated, and the maximum PV value among the PV values for all evaluated areas is 20 nm or less.

BEST MODE FOR CARRYING OUT THE INVENTION

Embodiments of the present invention are described below with reference to the appended drawings, and it is needless to say that various modifications are possible in addition to the embodiments without departing from the scope of the technical idea of the present invention.

Figure 1:
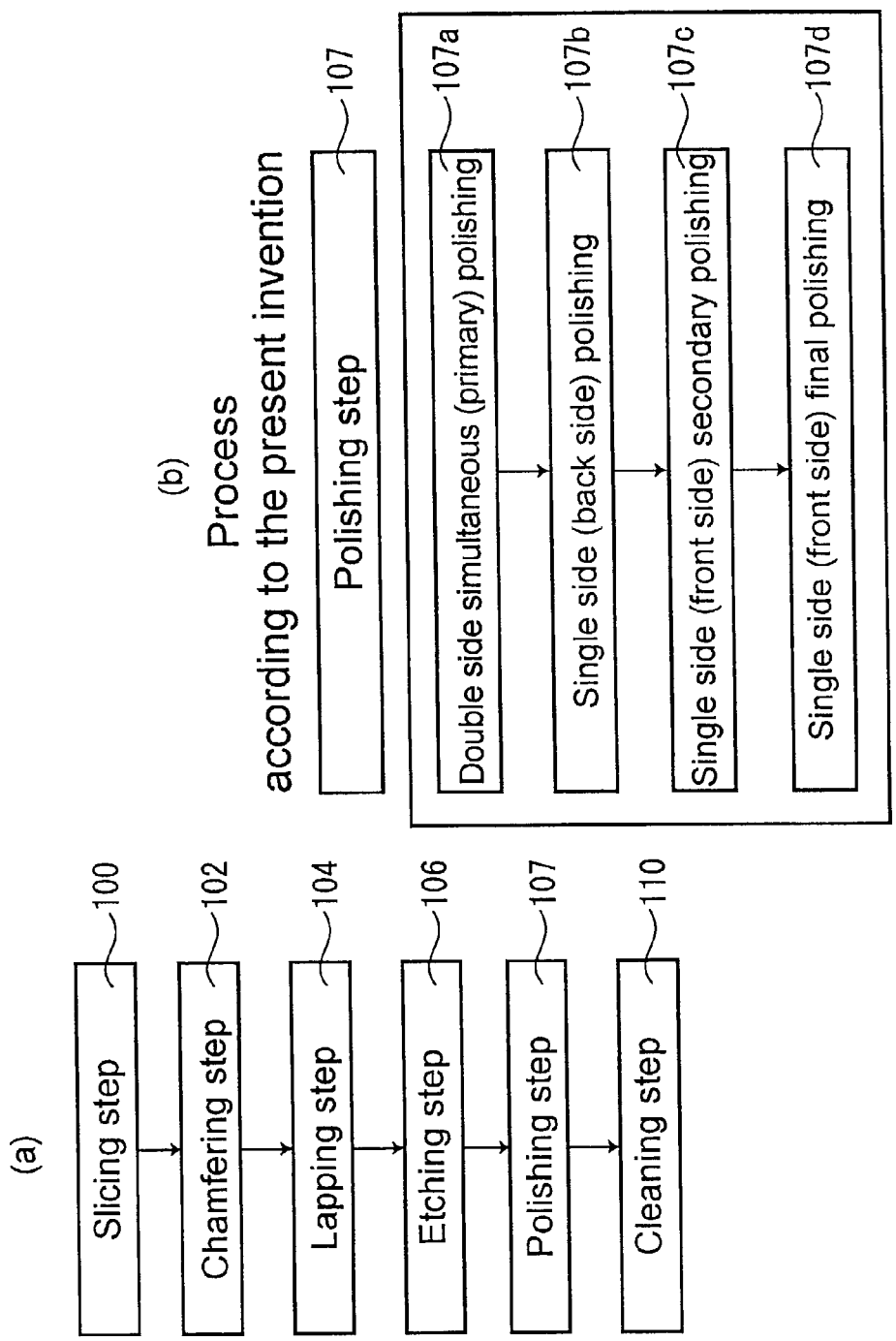
FIG. 1 is a flow chart showing an example of a process sequence in a first embodiment of a wafer manufacturing method according to the present invention, and a part (a) shows a wafer manufacturing process sequence, while a part (b) shows a polishing process sequence.

FIG. 1 is a flow chart showing an example of a process sequence in a first embodiment of a wafer manufacturing method according to the present invention, and a part (a) shows a wafer manufacturing process sequence, while a part (b) shows a polishing process sequence.

The wafer manufacturing process shown in FIG. 1(a) is similar to the conventional wafer manufacturing process shown in FIG. 18(a), but a polishing step 107 of the inventive method is different from the conventional polishing step 108.

The polishing step 107 of the inventive method, as shown in FIG. 1(b), comprises a double side simultaneous (primary) polishing step 107a, a single side (backside) polishing step 107b, a single side (front side) secondary polishing step 107c, and a single side (front side) final polishing step 107d. The different point of this process from the conventional double side polishing step 108B shown in FIG. 18(b) resides in that the single side (back side) polishing step 107b is provided after the double side simultaneous (primary) polishing 107a. As described hereinbefore, a reference plane of a wafer is produced by polishing a back surface of the wafer; this technical point is the greatest feature of the present invention.

Figure 15:
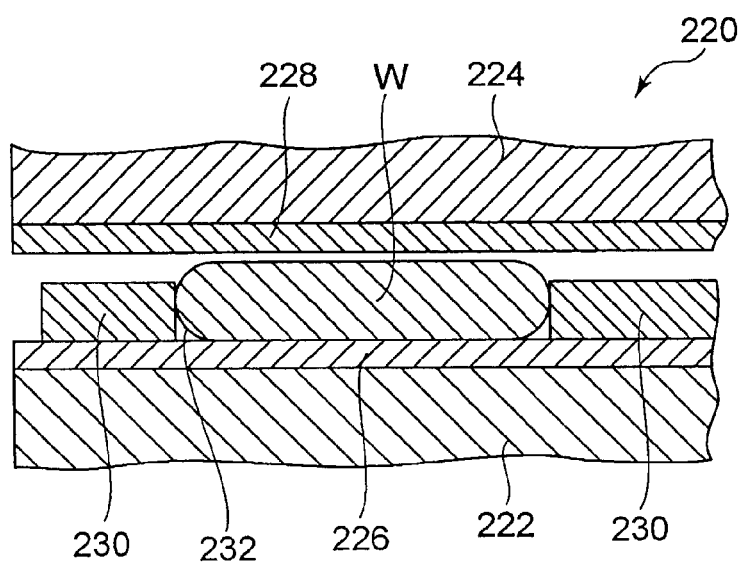
FIG. 15 is a picked out cross-sectional explanatory view of an essential part showing an example of a double side polishing apparatus.

To perform the double side simultaneous (primary) polishing step 107a, there may be used the double side polishing apparatus 220 generally known as an apparatus polishing simultaneously both the back surface and front surface of a semiconductor wafer as explained with reference to FIG. 15.

Figure 16:
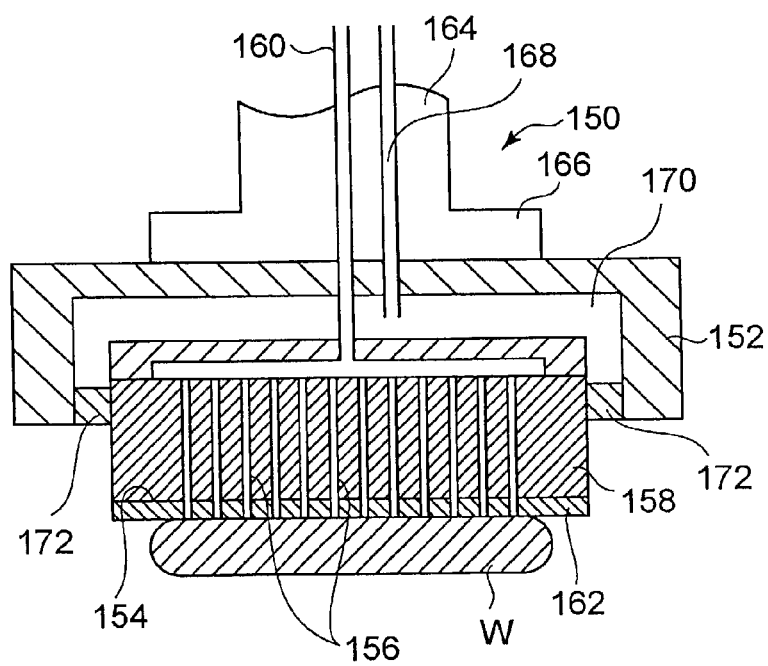
FIG. 16 is a picked out cross-sectional explanatory view of an essential part showing an example of a polishing apparatus used for back side polishing.

As for a polishing apparatus used in the back side polishing step 107b of the inventive feature, there is no limitation as long as the apparatus can produce a reference plane, and, for instance, the apparatus as shown in FIG. 16 may be used. In FIG. 16, a wafer holding plate 152 for polishing in a polishing apparatus 150 includes a wafer holding plate body 158 which is made of hard materials such as SiC with high flatness and provided with a wafer holding surface 154 and a number of throughholes 156 for vacuum chucking.

These throughholes 156 communicate through a vacuum path 160 with a vacuum unit (not shown), and when a vacuum is provided therein, a wafer (W) is vacuum chucked onto the wafer holding face 154. Further the wafer holding surface 154 of the wafer holding plate body 158 may be covered with a resin coating 162 having throughholes therein.

When polishing the wafer (W), the wafer (W) is held onto the wafer holding surface 154 of the wafer holding plate for polishing use 152 by means of vacuum chucking or the like, and the wafer holding plate 152 holding the wafer (W) is set to a polishing head 166 having a rotary shaft 164. Then the wafer (W) is rotated by the polishing head 166 and simultaneously is pressed to a polishing cloth adhered onto a turn table (not shown) rotating with a specified load.

The reference numeral 168 denotes an air supply path provided in parallel with the vacuum path 160, and this air supply path 168 can press down the wafer holding plate body 158 movably supported on the wafer holding plate 152 by an elastic support portion 172 made of rubber or the like by supplying air into a pressurizing space 170 provided inside the wafer holding plate 152 and above the wafer holding plate body 158, thus the wafer (W) being pressed to the polishing cloth of the turn table (not shown) under pressure.

A polishing agent is supplied at a specified flow rate onto the polishing cloth from a nozzle (not shown), and the wafer (W) is polished by the use of the polishing agent supplied between the wafer (W) and the polishing cloth. By provision of the above described polishing, a reference plane of the wafer (W) can be produced.

After the above polishing, although the wafer is still flat in the vacuum chucked state, when the vacuum chucking is released, the wafer is apt to return to the original shape. At this time, peripheral sags on a front surface of the wafer are improved.

When a stock removal is large even in case of the back side polishing, sags are apt to be generated in the periphery of a wafer. However, even if sags are generated on a back surface of a wafer, or inflection points are present thereon, in the secondary polishing step a front surface of the wafer is polished with keeping its configuration by holding a back surface of the wafer by means of a soft backing pad or the like not to transfer a back surface configuration, whereby only the front surface of the wafer can be turned into a mirror surface without being affected by the sags on the back surface thereof.

Marks of throughholes or the like may be transferred onto a polished surface. This is because that the wafer is forcibly vacuum chucked in the flat state to produce a reference plane so that a strong vacuum chucking force is inevitably required, with the result that configurations in the vicinity of the throughholes appear as marks after polishing. Such appearance of the marks of throughholes makes nanotopology of the wafer worse.

In this inventive method, however, as the back side polishing is performed, the above mentioned vacuum chucking marks appear on the back surface; the marks transferred onto the back surface have no effect on a front surface as in the case of the peripheral sags, so that the secondary polishing of the front surface can be performed without any problems.

Therefore, it is preferable to use a polishing apparatus named CMP in the single side (front side) secondary polishing step 107c in the inventive method. In the CMP, a wafer is held by a soft backing pad or the like and polished with keeping a configuration of the wafer surface to be polished. In this step, it is preferable to set the hardness of the polishing cloth to an Asker C hardness of the order of 70 to 90, that is, rather harder than the ordinary polishing cloth.

It is preferable that in this secondary polishing step 107c, the stock removal is 2 μm or less, and especially when both the secondary polishing step 107c and the final polishing step 107d are included together, the stock removal is in the order of 1 to 1.5 μm. With such a stock removal level as described above, in this polishing step generation of peripheral sags is prevented, and also a mirror polished surface is made sufficiently.

It should be noted that a configuration of a wafer can be corrected also in the secondary polishing step 107c by increasing the stock removal with a polishing head using a retainer ring or the like. However, when such polishing as described above is performed, a wafer having inflection points may be easily manufactured. Therefore, in the secondary polishing step 107c, it is preferable to set a stock removal in a manner that correction of a configuration of a wafer is substantially not made, and to polish the wafer with keeping the configuration obtained in the primary polishing step 107a (and back side polishing step 107b).

Figure 14:
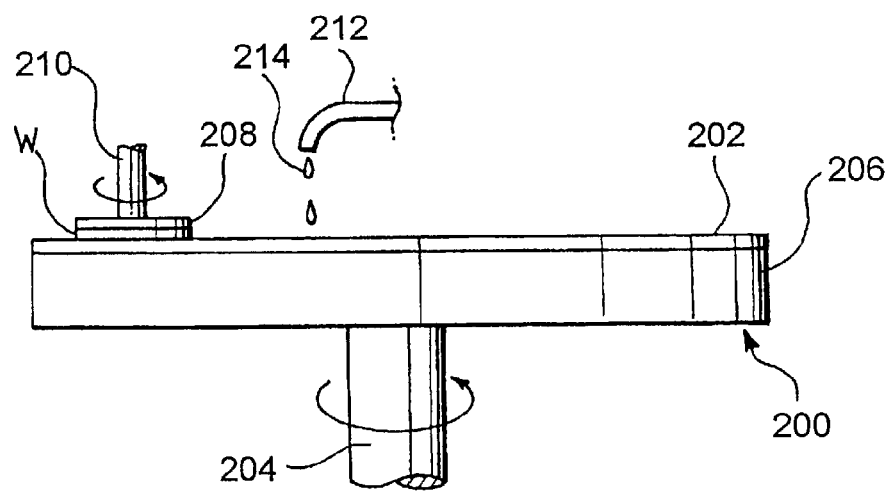
FIG. 14 is an explanatory side view showing an example of a single side polishing apparatus.

In the final polishing step 107d, polishing is performed using the conventional single side polishing apparatus 200 as described in FIG. 14 and a suede type polishing cloth and the like.

Generally, there is a tendency that the more stock removal, the larger peripheral sags of a wafer. Therefore, in order to improve flatness and nanotopology of a reference plane, a stock removal of the front surface of the wafer should be desirably small.

By improving flatness (peripheral sags) in the state where a stock removal of the entire front surface of a wafer is small and polishing the wafer in a manner that a back surface of the wafer is not transferred in the secondary polishing step and afterward, it is possible to manufacture a wafer having improved flatness and nanotopology for the surface reference, and especially a wafer having no change in irregularities of 0.02 μm or more, that is, no large inflection point in the vicinity of 2 to 20 mm from a peripheral edge of the wafer.

Figure 7:
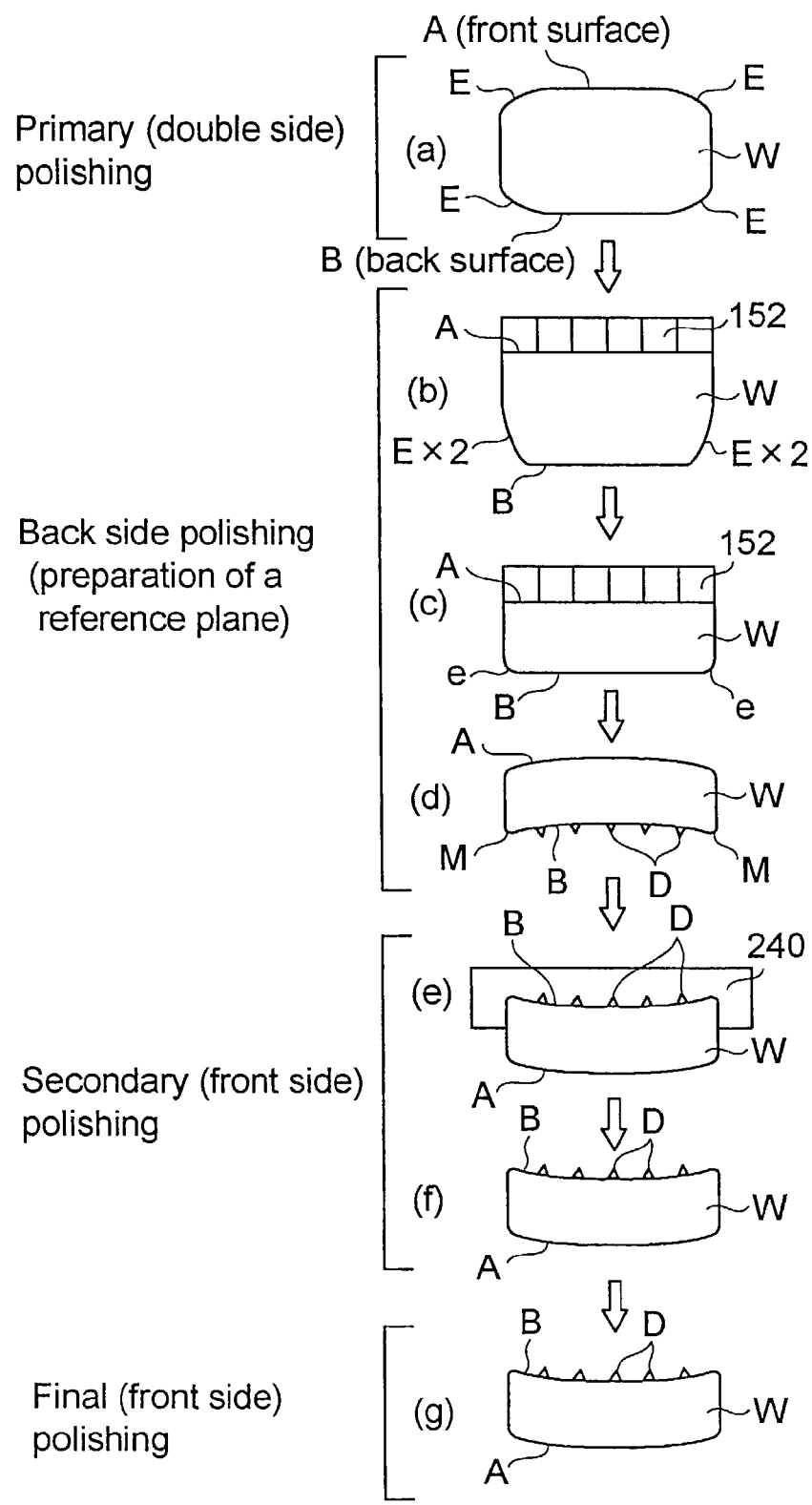
FIG. 7 is a schematic view showing an example of a process sequence in the first embodiment of the wafer manufacturing method according to the present invention.

Next, using FIG. 7 that is a schematic view showing an example of a process sequence in the first embodiment of the wafer manufacturing method according to the present invention, there are explained changes in a configuration of a wafer in each of the polishing steps in the inventive process. At first, a front surface (A) and a back surface (B) of a wafer (W) are subjected to the primary (double side) polishing, for instance, by the use of the same double side polishing apparatus as shown in FIG. 1 (FIG. 7(a)).

The polishing conditions for this primary (double side) polishing step are not limited especially but the polishing should preferably be performed under the following conditions.

Polishing load: 200 to 600 g/cm$^2$ (20 to 60 kPa)
Polishing cloth: nonwoven fabric type (an Asker C hardness of the order of 60 to 80)
Polishing agent: containing colloidal silica (pH=10 to 11)
Supplying rate: 4 to 6 L/min
Stock removal: in the order of 5 μm to 20 μm for both surfaces, and more preferably about 16 μm for both surfaces.

The above Asker C hardness is a value measured using an Asker rubber hardness meter Model C that is one of spring hardness testers, and corresponds to SRIS 0101 that is the Society of Rubber Industry (Japan) Standard.

This wafer (W) polished in the double side polishing step is improved in tapers, but sags (E) have been generated in the periphery of the wafer (W) as shown in FIG. 7(a).

Then this wafer (W) is subjected to the back side polishing (production of a reference plane) (FIGS. 7(b), (c) and (d)). In this back side polishing step, as a polished wafer holding plate for the polishing apparatus, there is used a hard holding plate 152 made of SiC which includes the wafer holding surface 154 and a number of throughholes 156 for vacuum chucking and the holding surface 154 of the wafer holding plate 152 is covered with an epoxy resin coating film 162 as the polishing apparatus 150 shown in FIG. 16.

When vacuum chucking the wafer (W) with this wafer holding plate 152, the vacuum chucked wafer surface becomes flat with irregularities being generated on the other wafer surface. FIG. 7(b) shows the state where the bottom surface of the wafer becomes convex. In this state the sags (E) in the periphery section of the wafer (W) increase by a factor of two (E×2).

When polishing this wafer in a vacuum chucked state, a flat wafer (W) is manufactured as shown in FIG. 7(c).

The polishing conditions for this back side polishing step are not limited especially but the polishing should be preferably performed under the following conditions.

Polishing load: 200 to 600 g/cm$^2$ (20 to 60 kPa)
Polishing cloth: nonwoven fabric type (an Asker C hardness of the order of 60 to 80)
Polishing agent: containing colloidal silica (pH=10 to 11)
Supplying rate: 5 to 15 L/min
Stock removal: in the order of 3 μm to 8 μm and more preferably about 5 μm.

By the provision of the back side polishing step as described above, a reference plane of the wafer can be produced. However, even in this polishing, sags may be slightly generated in the periphery of the wafer. Although the wafer is flat in the vacuum chucked state, when the vacuum chucking is released, the wafer is apt to return to the original configuration as shown in FIG. 7(*d*). Also as shown in FIG. 7(*d*), the vacuum chucking marks (D) may be transferred onto the polished surface. The sags (e) or vacuum chucking marks (D) appear only on the back surface (B) of the wafer (W), and although the front surface (A) of the wafer (W) is improved in flatness, the surface state thereof is unchanged as compared with that subjected to the primary polishing.

Figure 17:
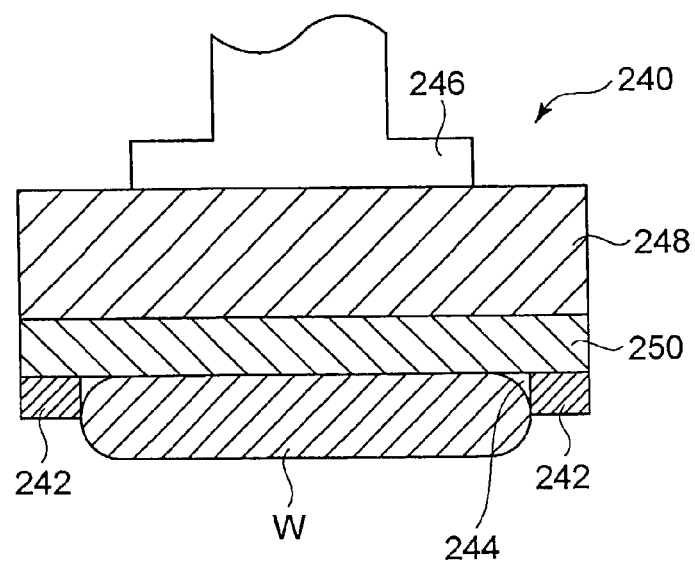
FIG. 17 is a picked out cross-sectional explanatory view of an essential part showing an example of a wafer polishing apparatus based on a template system.

The wafer (W) in the state described above is subjected to the secondary (front side) polishing (FIGS. 7(*e*) and (*f*)). Any type of polishing apparatus and polishing method conventionally employed may be applied to the secondary polishing without any special limitation, but there is preferably used for the above polishing the polishing apparatus 240 as shown in FIG. 17 wherein a wafer is held by the backing pad 250 and a polishing cloth slightly harder than that used in the conventional secondary polishing step is used.

The polishing conditions for this secondary (front side) polishing step are not limited especially but the polishing should be preferably performed under the following conditions.
Polishing load: 100 to 300 g/cm$^2$ (10 to 30 kPa)
Polishing cloth: nonwoven fabric type, suede type or polyurethane type (an Asker C hardness of the order of 70 to 90)
Polishing agent: containing colloidal silica (pH=10 to 11)
Supplying rate: 10 L/min or more
Stock removal: several μm, preferably 2 μm or less.

Briefly, in the secondary (front side) polishing step, using CMP with the soft backing pad 250 (FIG. 17) and the relatively hard polishing cloth, a wafer is polished in a manner that only a configuration of the front surface of the wafer is corrected without a configuration of the back surface thereof being transferred. The backing pad 250 (FIG. 17) is preferably made of a urethane foam pad and is 300 μm or less in thickness. The hardness of the polishing cloth should be preferably in the Asker C hardness of the order of 70 to 90.

There is no specific limitation on the polishing cloth used in each of the polishing steps, but as a polishing cloth (or polishing pad) in the polishing steps a nonwoven type polishing cloth or a suede type polishing cloth is mainly used.

The nonwoven type polishing cloth is generally made of polyester felt (its tissue has random structure) impregnated with polyurethane, and has porosity, adequate elasticity, and excellence in a high polishing rate and flatness, thereby being capable of making the stock removal large, which is used mainly in the primary or secondary polishing step or others.

The suede type polishing cloth is generally composed of a base body made of polyester felt impregnated with polyurethane, a foamed layer formed in the polyurethane and opening portions provided on the formed layer by removing the surface section of the polyurethane (this layer is named a nap layer), and is used especially for finishing, a polishing agent kept in the foamed layer being reacted between a work and an internal surface of the foamed layer to let the polishing proceed. This suede type polishing cloth is used very often in chemical mechanical polishing to give a surface of no damage.

Recently, there has been developed a three layer polishing cloth not using nonwoven fabrics which comprises, for instance, a base body of a hard plastic sheet, a surface layer of a nap layer made of urethane, and an elastic sheet provided under the base body. Among the polishing cloths described above the most suitable one to each of the polishing steps should be selected. Further a step similar to this secondary polishing step may be provided additionally.

The wafer (W) polished in the secondary polishing is subjected to the final polishing (FIG. 7(*g*)). The final polishing may be performed using a conventional method. The polishing apparatus for the final polishing is not limited especially and the final polishing step should be preferably performed under the following conditions.
Polishing load: 100 to 200 g/cm$^2$ (10 to 20 kPa)
Polishing cloth: suede type
Polishing agent: containing colloidal silica (pH=10 to 11)
Supplying rate: 0.5 to 1 L/min
Stock removal: A stock removal of 0.1 m or less is enough.

In the wafer which has been polished through the polishing steps as shown in FIG. 7(*a*) to FIG. 7(*g*), there are few inflection points and the like on the surface thereof and the sags are improved; a wafer with high flatness can be manufactured. Polishing conditions in each step above described may be appropriately determined to the most suitable conditions according to a configuration of a wafer.

Figure 10:
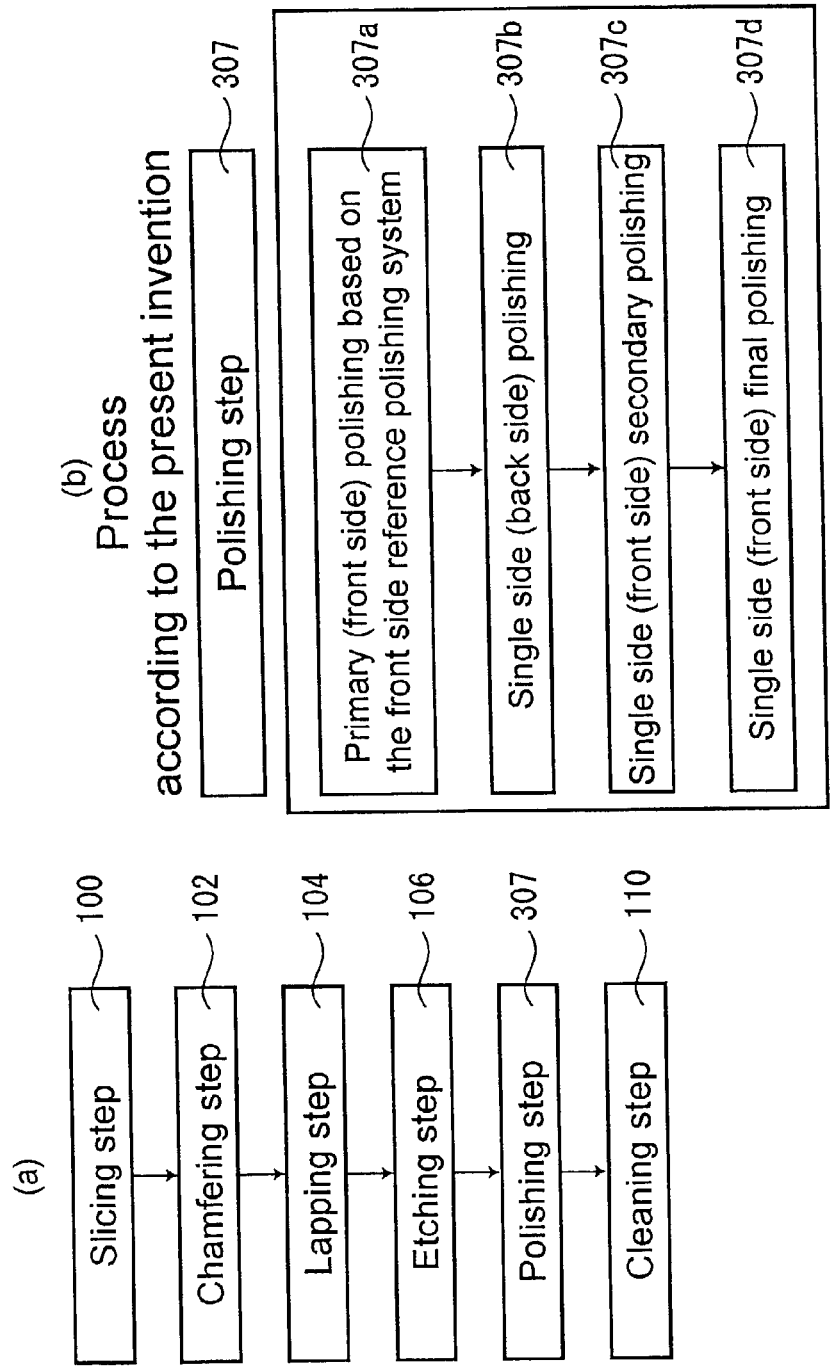
FIG. 10 is a flow chart showing an example of a process sequence in a second embodiment of the wafer manufacturing method according to the present invention, and a part (a) shows a wafer manufacturing process sequence, while a part (b) shows a wafer polishing process sequence.

In the first embodiment of the inventive method shown in FIG. 1, there is described the case where the double side simultaneous polishing is performed as the primary polishing, but another type polishing method may be used as the primary polishing, and this method is described below. FIG. 10 is a flow chart showing an example of a process sequence in a second embodiment of the wafer manufacturing method according to the present invention, and a part (a) shows a wafer manufacturing process sequence, while a part (b) shows a wafer polishing process.

Figure 18:
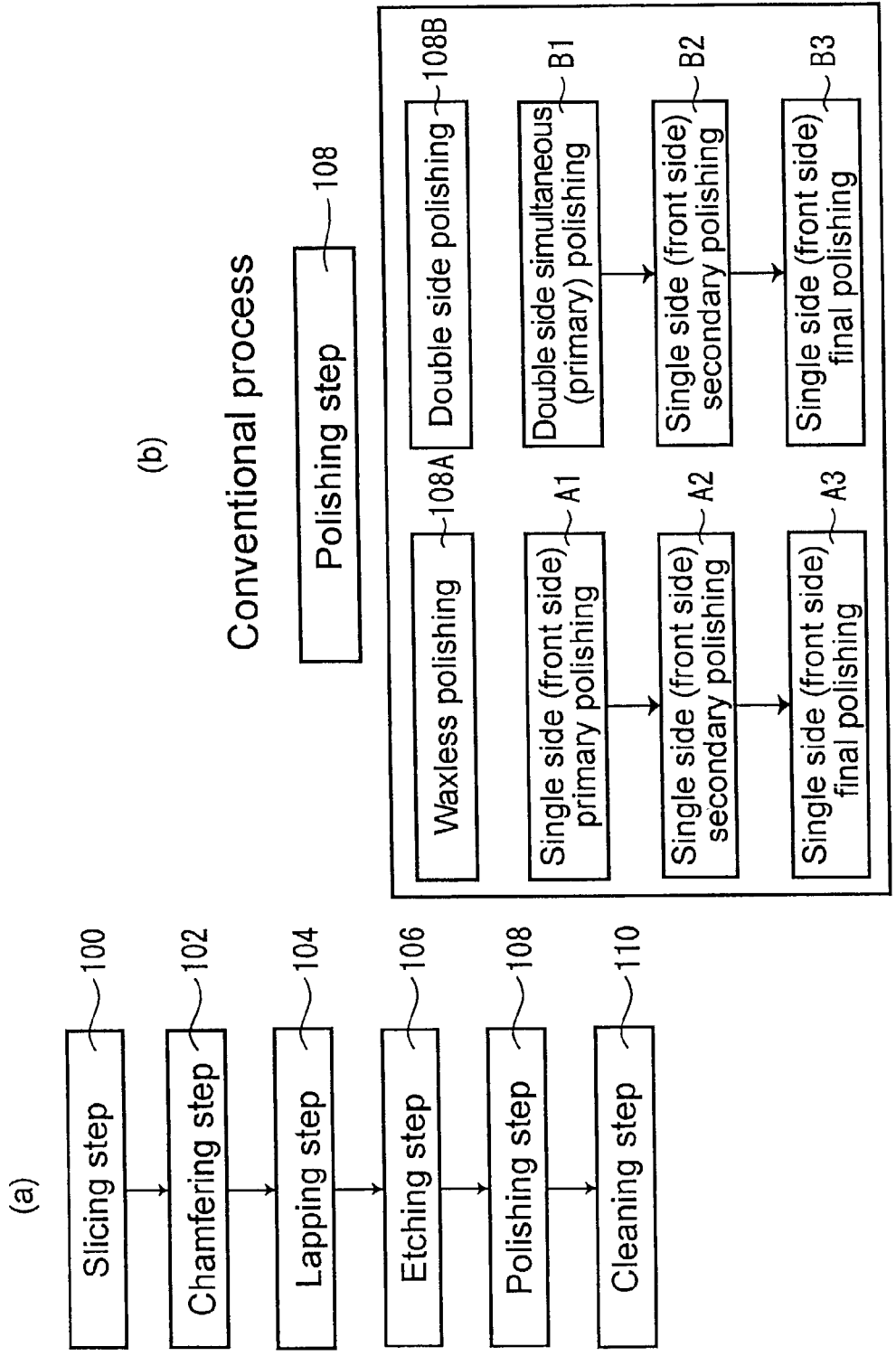
FIG. 18 is a flow chart showing an example of a process sequence of a conventional wafer manufacturing method, and a part (a) shows a wafer manufacturing process sequence, while a part (b) shows a polishing process sequence.

The wafer manufacturing process shown in FIG. 10(*a*) is the same as the conventional wafer manufacturing process shown in FIG. 18(*a*) and the first embodiment of the inventive wafer manufacturing process shown in FIG. 1(*a*), but a polishing step 307 in the second embodiment is different from the conventional polishing step 108 and the polishing step 107 shown in FIG. 1(*a*).

The polishing step 307 of the second embodiment according to the inventive method, as shown in FIG. 10(*b*), comprises a front side (single side) primary polishing step 307*a* based on the front side reference polishing system, a back side (single side) polishing step 307*b*, a front side (single side) secondary polishing step 307*c*, and a front side (single side) final polishing step 307*d*. The front side (single side) primary polishing step 307*a* based on the front side reference polishing system means polishing for one based on the so-called template system using a backing film or the waxless system including a polishing system holding a wafer by an elastic body and other polishing systems. That is, it is a polishing system in which a wafer is polished in a manner that the wafer is not forcibly held by means of vacuum chucking or the like, and is not fixed to a holding plate or the like to be a reference plane. The different point of this system from the conventional waxless polishing step 108A shown in FIG. 18(*b*) resides in that the single side (back side) polishing 307*b* is performed after the waxless polishing step 307*a* based on the front side reference polishing system. As described above, the greatest feature of this invention is in that a reference plane of a wafer is produced by polishing a back surface of the wafer.

To carry out the polishing step 307*a* based on the front side reference polishing system, the polishing apparatus as already described with reference to FIG. 17 may be used.

The back side polishing step 307*b*, secondary polishing step 307*c*, and final polishing step 307*d* correspond to the back side polishing step 107*b*, secondary polishing step 107*c*, and final polishing step 107d shown in FIG. 1(b), respectively, and these steps are equal to each other, so a repetitious description thereof is omitted.

Changes in a configuration of a wafer in each of the polishing steps in the second embodiment of the inventive process are almost similar to the description of FIG. 7 showing the first embodiment of the present invention. A different point of the second embodiment from the first embodiment resides in that a wafer after the polishing step 307a based on the front side reference polishing system has a surface state where the front surface thereof turns into a mirror surface and the back surface thereof is an etched surface. However, sags are generated in the periphery of the wafer (W) due to polishing as well as etching, and the configuration thereof is similar to that shown in FIG. 7(a).

The second embodiment of the inventive method is described below focusing on the different point thereof from the first embodiment of the inventive method in which double side polishing is performed in the primary polishing step. The polishing conditions for the polishing (primary polishing) step based on the front side reference polishing system in the second embodiment of the inventive method are not limited especially but the polishing should be preferably performed under the following conditions.

Polishing load: 200 to 600 g/cm² (20 to 60 kPa)
Polishing cloth: unwoven fabric type (an Asker C hardness of the order of 60 to 80)
Polishing agent: containing colloidal silica (pH=10 to 11)
Supplying rate of polishing agent: 4 to 6 L/min
Stock removal: 5 to 10 μm, preferably about 8 μm.

Then this wafer is subjected to the back side polishing. That is, a reference plane is produced corresponding to FIGS. 7(b), 7(c), and 7(d). When the primary polishing step is, for instance, waxless polishing based on the template system, the sags in the periphery of the wafer shown in FIG. 7(b) are the sum of the sags on the front surface (polished surface) and the sags on the back surface (etched surface).

The polishing conditions for the back side polishing step in the second embodiment of the inventive method are not limited especially but the polishing should be preferably performed under the following conditions.

Polishing load: 200 to 600 g/cm² (20 to 60 kPa)
Polishing cloth: unwoven fabric type (an Asker C hardness of the order of 60 to 80)
Polishing agent: containing colloidal silica (pH=10 to 11)
Supplying rate of polishing agent: 5 to 15 L/min
Stock removal: 5 to 10 μm, preferably about 8 μm.

As the back surface of the wafer is an etched surface, in the primary polishing step the wafer is preferably polished with the stock removal being slightly larger than that when the double side polishing is performed. The subsequence steps are equal to those in the first embodiment of the inventive method shown in FIG. 1(b), so a repetitious description thereof is omitted.

Figure 11:
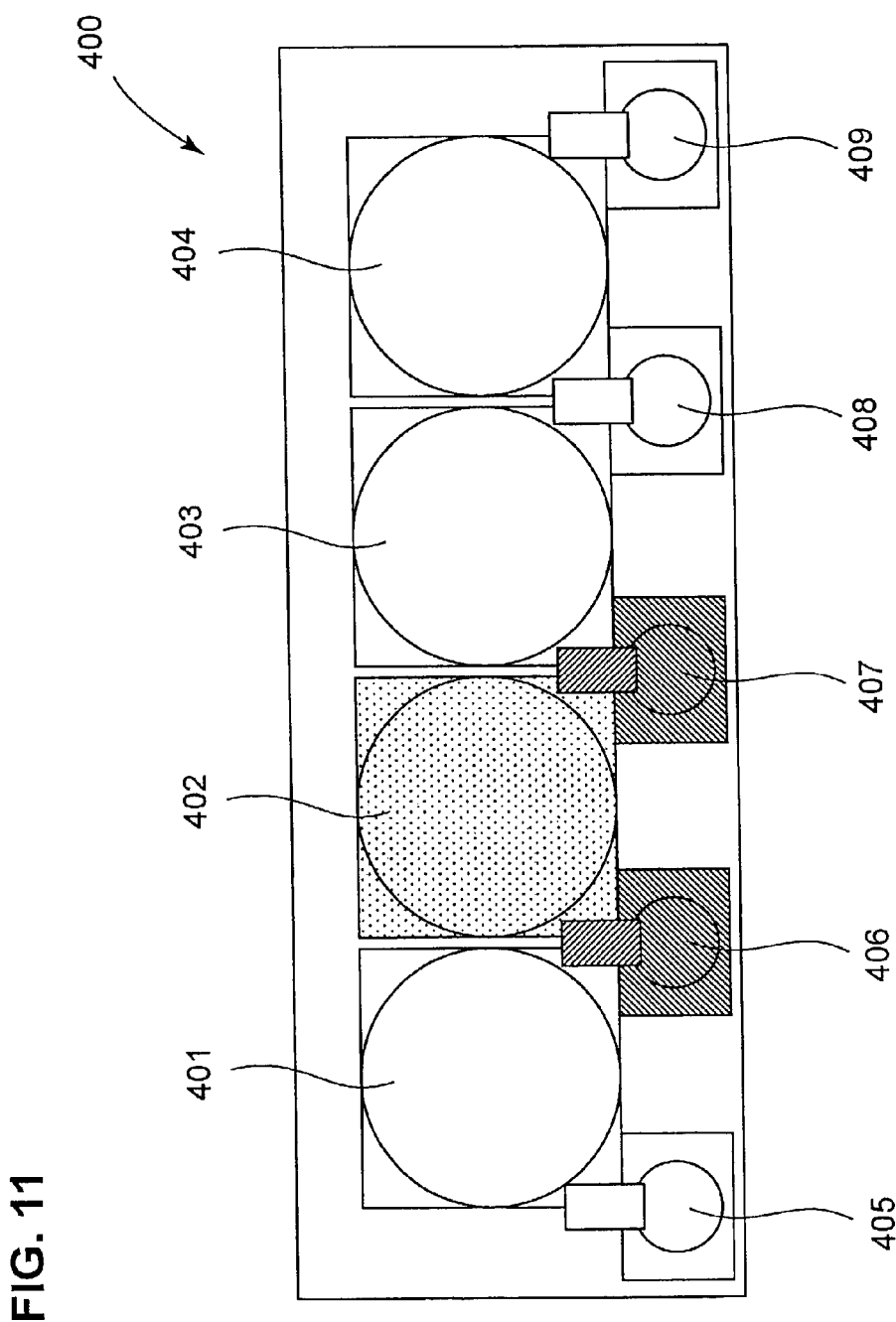
FIG. 11 is a schematic explanatory plan view showing an embodiment of a wafer manufacturing apparatus according to the present invention.

The multistage polishing in the second embodiment of the inventive method may be performed using independent polishing apparatuses such as an apparatus specialized for performing the primary polishing step, and an apparatus specialized for performing the back side polishing step, but it is preferable to use a composite polishing apparatus in which a plurality of polishing apparatuses are integrally arranged. FIG. 11 is a schematic explanatory plan view showing an embodiment of the inventive composite polishing apparatus suited for performing the second embodiment of the inventive method in which four independent polishing apparatuses are integrally arranged.

In FIG. 11, a polishing apparatus 400 according to the present invention comprises four different types of polishing apparatuses arranged successively; a front side (single side) primary polishing section (a first polishing section) 401, a back side (single side) polishing section (a second polishing section) 402, a front side (single side) secondary polishing section (a third polishing section) 403, and a front side (single side) final polishing section (a fourth polishing section) 404.

In FIG. 11, reference numeral 405 denotes a first conveyor arm for conveying a wafer from a previous step to the first polishing section 401. A first inverting unit 406 for turning a wafer upside down is provided between the first polishing section 401 and the second polishing section 402, whereby a wafer with the polished front surface can be turned over for polishing the back surface thereof in the next step. Similarly, a second inverting unit 407 for turning a wafer upside down is provided too between the second polishing section 402 and the third polishing section 403, and hence the front surface of the wafer can be polished in the third polishing section 403.

The mechanism for turning over a wafer as described above is not required in the conventional polishing apparatus in which only a front surface of a wafer is polished, but in the present invention, it is important to perform polishing in the sequence of front side polishing, back side polishing, and front side polishing; therefore the mechanism as described above is required. In FIG. 11, reference numeral 408 denotes a second conveyor arm, which conveys a wafer polished in the third polishing section 403 to the fourth polishing section 404. Designated by 409 is a third conveyor arm, which conveys a wafer final polished in the fourth polishing section 404 to the next step.

Figure 12:
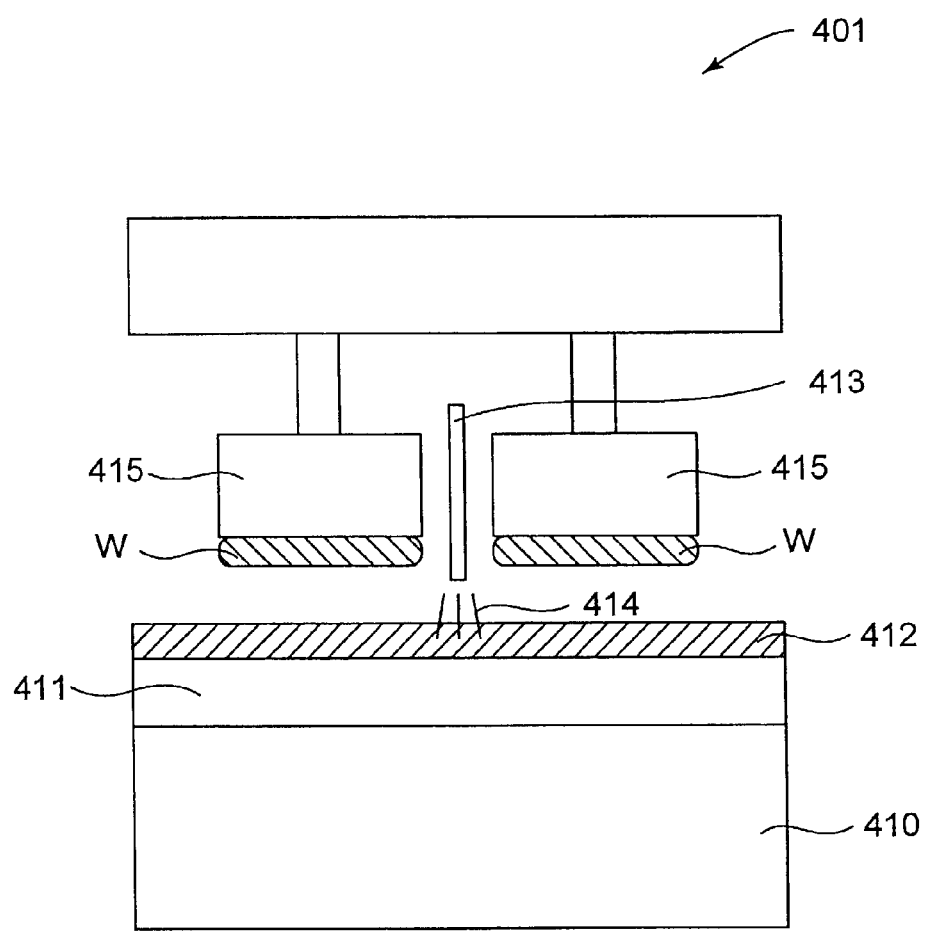
FIG. 12 is a schematic explanatory enlarged side view showing an essential part of FIG. 11.

FIG. 12 is a schematic explanatory side view showing the first polishing section 401. In this figure, designated by 410 is a base, and a turn table 411 is provided on a top surface thereof. This turn table 411 is rotatably driven by a drive shaft (not shown). The polishing cloth 412 is adhered on a top surface of the turn table 411, and polishing is performed supplying slurry 414 from the slurry supplying unit 413 onto this polishing cloth 412. A polishing head 415 is hung movably up and down and rotatably, and a wafer held thereby is polished by pressing it slidably onto the polishing cloth 412 at an optional polishing pressure. Further each polishing section may comprise a polishing apparatus based on a batch system in which a plurality of wafers are processed together, but it is preferable to use a polishing apparatus having a single wafer polishing head 415 which processes wafers sheet by sheet because a diameter of a wafer becomes larger and this type of polishing apparatus is easy to handle. Here, the polishing head 415 may be based on either a single shaft system or a multiple shaft system (the so-called multi-shaft single wafer system). It should be noted that the basic structure of the first polishing section 401 is common to the second polishing section 402, third polishing section 403, and fourth polishing section 404 excluding the different points in the concrete structure of the polishing head 415 as described below, and individual description of each of the polishing sections 402 to 404 is omitted.

The polishing head (246 in FIG. 17) based on the waxless system as shown in FIG. 17 is used as a polishing head 415 of the first polishing section 401 shown in FIG. 12. In the second polishing section 402, the polishing head (166 in FIG. 16) having a polishing mechanism based on the vacuum chucking system as shown in FIG. 16 is used as a polishing head, and thereby a wafer is vacuum chucked onto a flat wafer holding plate (152 in FIG. 6) for making forcibly the wafer flat and polishing the back surface thereof. The polishing head (246 in FIG. 17) based on the waxless system as shown in FIG. 17 is used as a polishing head in the third polishing section 403 and in the fourth polishing section 404. It is preferable to perform polishing for the front surface under the conditions enabling gradually fine polishing as the polishing proceeds. Especially the polishing in each step should be performed under the polishing conditions as described above.

The operation of the polishing apparatus 400 according to the present invention will now be described. At first, an etched wafer is conveyed to the first polishing section 401 by the first conveyor arm 405. The first polishing section 401 is provided with a polishing head (246 in FIG. 17) based on the waxless system as shown in FIG. 17 as the polishing head 415, and holds a back surface of a wafer for polishing a surface (front surface) for fabricating a device thereon. Then, the polishing head 415 is moved downward and performs polishing under optional polishing conditions (the primary polishing conditions).

The polished wafer is turned upside down by the first inverting unit 406. There is no specific limitation on the inverting function of the wafer inverting unit 406, but a wafer may be preferably turned upside down by a robot arm or the like.

The inverted wafer with the back surface now faced upward is then conveyed to the second polishing section 402, and the front surface of the wafer is held by a polishing head similar to the polishing head (166 in FIG. 16) as shown in FIG. 16, thereby the wafer being forcibly flat, and after that the polishing head is moved down to polish the back surface of the wafer under optional polishing conditions (the back surface polishing conditions).

The polished wafer is again turned upside down by the second inverting unit 407 having the same inverting function as the first inverting unit 406.

The wafer again turned upside down with the front surface faced upward now is then conveyed to the third polishing section 403, and the back surface of the wafer is held by a polishing head as shown in FIG. 17, and after that the polishing head is moved down to secondary polish the front surface of the wafer under optional polishing conditions (the secondary polishing conditions).

Next, the secondary polished wafer is conveyed to the fourth polishing section 404 by the second conveyor arm 408, and the back surface of the wafer is held by a polishing head (246 in FIG. 17) as shown in FIG. 17, and after that the polishing head is moved down to final polish the front surface of the wafer under optional polishing conditions (the final polishing conditions).

After the final polishing, the wafer is conveyed to the subsequent cleaning process by the third conveyor arm 409.

With the process sequence as described above, the front surface and back surface of the wafer are polished to thereby obtain a wafer with high flatness.

Figure 13:
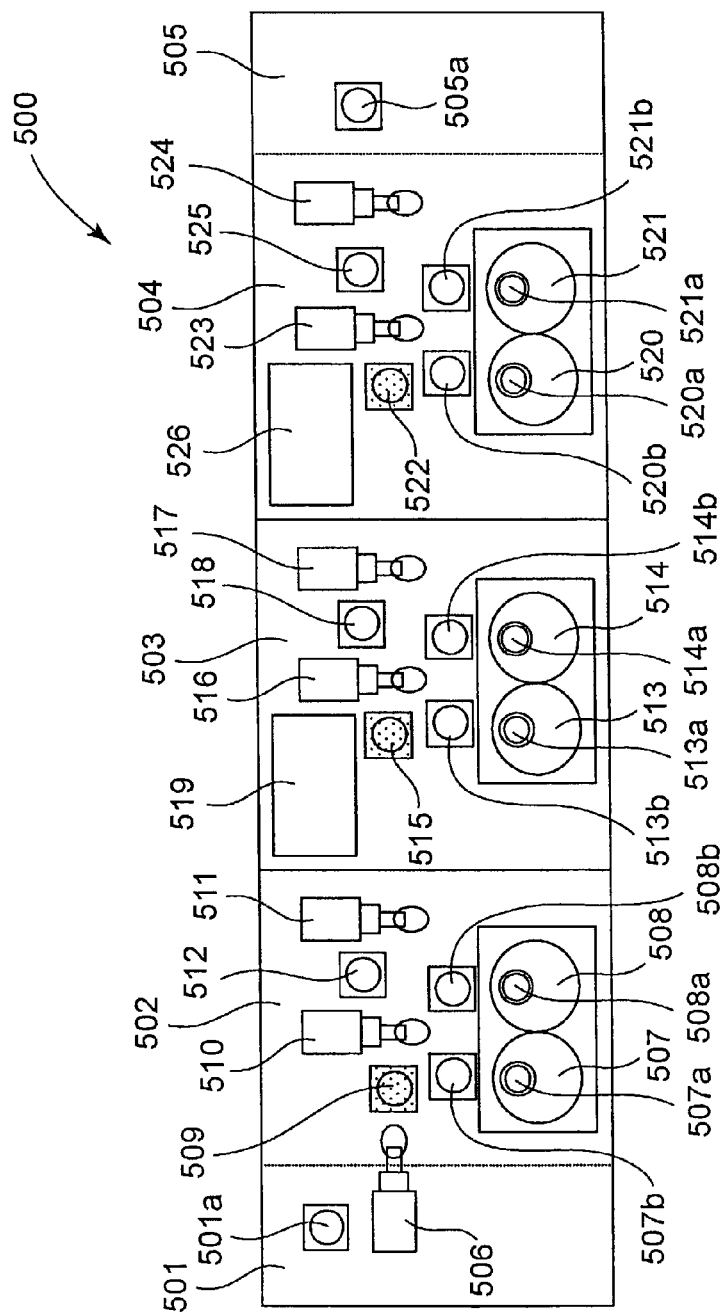
FIG. 13 is a schematic explanatory plan view showing another embodiment of a wafer manufacturing apparatus according to the present invention.

The embodiment shown in FIG. 11 shows an example in which four polishing apparatuses are integrally arranged to form the polishing apparatus according to the present invention, but the polishing apparatus according to the present invention can also be formed by arranging three polishing apparatuses integrally. FIG. 13 is a schematic explanatory plan view showing another embodiment of a polishing apparatus according to the present invention in which three polishing apparatuses are integrally arranged.

In FIG. 13, a polishing apparatus 500 according to the present invention comprises three different types of polishing apparatuses arranged successively; a front side (single side) primary polishing section (a first polishing section) 502, a back side (single side) polishing section (a second polishing section) 503, and a front side secondary final polishing section (third polishing section) 504. Designated by 501 is a loader section comprising a first delivery stage 501a and a first conveyor arm 506. Designated by 505 is an unloader section comprising a fifth delivery stage 505a.

The first polishing section 502 comprises first and second polishing stages 507, 508, a first positioning stage 509, second and third conveyor arms 510, 511, and a second delivery stage 512. The first and second polishing stages 507, 508 are provided with first and second heads 507a, 508a, and first and second polishing machine loaders 507b, 508b, respectively.

The second polishing section 503 comprises third and fourth stages 513, 514, a second positioning stage 515, fourth and fifth conveyor arms 516, 517, a third delivery stage 518, and further a first cleaning unit 519. The fourth conveyor arm 516 functions as a first inverting unit. The third and fourth polishing stages 513, 514 are provided with third and fourth polishing heads 513a, 514a and third and fourth polishing machine loaders 513b, 514b.

The third polishing section 504 comprises fifth and sixth polishing stages 520, 521, a third positioning stage 522, sixth and seventh conveyor arms 523, 524, a fourth delivery stage 525, and further a second cleaning unit 526. The sixth conveyor arm 523 functions as a second inverting unit. The fifth and sixth stages 520, 521 are provided with fifth and sixth heads 520a, 521a, and fifth and sixth polishing machine loaders 520b, 521b, respectively. In the example shown in FIG. 13, among the two polishing stages, namely the fifth and sixth polishing stages 520, 521 in the third polishing section 504, the fifth polishing stage 520 is used for front side secondary polishing, and the sixth polishing stage 521 is used for final polishing.

With the construction described above, the operation will now be described. At first, wafers to be polished are supplied from the loader 501. The wafers are conveyed by the first conveyor arm 506 from the first delivery stage 501a to the first positioning stage 509, where the wafers are positioned, and the wafers are conveyed and set by the second conveyor arm 510 to the first and second polishing loaders 507b, 508b. Then, the wafers are conveyed to the undersides of the first and second polishing heads 507a, 508a in the first polishing section (front side primary polishing section) 502 by the first and second polishing machine loaders 507b, 508b, and the wafers are held by the first and second polishing heads 507a, 508a. After that, the first and second polishing machine loaders 507a, 508b are returned to the original positions. The wafers held by the first and second polishing heads 507a, 508a are pressed slidably on the polishing cloth and polished thereby. In the example shown in FIG. 13, in order to improve the work efficiency, two polishing stages, namely the first and second polishing stages 507, 508 are provided, and wafers are supplied to the polishing stages and polished therein, respectively. The wafers polished therein are again conveyed to outside of the polishing machine by the first and second polishing machine loaders 507b, 508b, and are conveyed to the second delivery stage 512 by the second conveyor arm 510.

Next, the front side primary polished wafers are conveyed by the third conveyor arm 511 to the first cleaning unit 519 of the second polishing section 503 where the wafers are cleaned. This cleaning unit 519 should be preferably based on dipping type cleaning by the use of a SC1 liquid (a cleaning liquid mixture of ammonia, hydrogen peroxide and water), in which a wafer is processed in the sequence of a rinsing liquid, the SC1 liquid, a rinsing liquid, and a rinsing liquid.

After this cleaning, the wafers are turned upside down by the fourth conveyor arm (the first inverting unit) 516 and are conveyed to the second positioning stage 515 where the wafers are positioned. The positioned wafers are conveyed by the fourth conveyor arm 516 to the third and fourth polishing machine loaders 513b, 514b. Then the wafers are conveyed by the third and fourth polishing machine loaders 513b, 514b to undersides of the polishing heads 513a, 514a in the second polishing section (back side polishing section) 503, and the back surfaces of the wafers are polished in the state where the wafers are held by the polishing heads 513a, 514a. In the example shown in FIG. 13, two polishing stages, namely third and fourth polishing stages 513, 514 are provided for improving the work efficiency, and wafers are supplied to the respective polishing stages where the wafers are polished. The wafers polished therein are conveyed by the third and fourth polishing machine loaders 513b, 514b to outside of the polishing machines and are conveyed by the fourth conveyor arm 516 to the third delivery stage 518. This back side polished wafers are conveyed by the fifth conveyor arm 517 to the second cleaning unit 526 in the third polishing section 504 (its cleaning conditions are the same as those of the first cleaning unit 519) for cleaning.

After the cleaning, the wafers are turned upside down by the sixth conveyor arm (the second inverting unit) 523, and are conveyed to the third positioning state 522 for positioning. The positioned wafers are conveyed to the fifth and sixth polishing loaders 520b, 521b by the sixth conveyor arm 523. After that, the wafers are conveyed by the fifth and sixth polishing machine loaders 520b, 521b to the fifth polishing stage (front side secondary polishing stage) 520 in the third polishing section (front side secondary polishing/final polishing section) 504, where front surfaces of the wafers are secondary polished. The front side secondary polished wafers are conveyed by the fifth polishing machine loader 520b to outside of the polishing machine, and are positioned by the sixth conveyor arm 523 at the third positioning stage 522, and then are conveyed again by the sixth conveyor arm 523 to the sixth polishing machine loader 521b. Next, the wafers are conveyed by the sixth polishing machine loader 521b to the final polishing stage (the sixth polishing stage) 521 in the third polishing section 504 where the wafers are final polished.

The final polished wafers are conveyed by the sixth polishing machine loader 521b to outside of the polishing machine and are conveyed by the sixth conveyor arm 523 to the fourth delivery stage 525. This final polished wafers are conveyed by the seventh conveyor arm 524 to the fifth delivery stage 505a in the unloader section 505 and finally are conveyed to the next (cleaning) step.

EXAMPLES

The present invention will be more specifically described with reference to examples thereof, but it is needless to say that these examples are not construed to limit the scope of the invention.

Inventive Example 1

An 8-inch wafer having been subjected to a general process including slicing, chamfering, lapping, and etching was polished by the inventive method.

The polishing process in the inventive method was carried out, as shown in FIG. 7, in the sequence of a double side (simultaneous) polishing (front side primary polishing) step (FIG. 7(a)), → a single side polishing (back side polishing) step (FIGS. 7(b), 7(c), and 7(d)), → a single side secondary polishing (front side secondary polishing) step (FIGS. 7(e) and 7(f)), → a single side final polishing (front side tertiary polishing) step (FIG. 7(g)).

(1) Double Side (Simultaneous) Primary Polishing Step

The AC 2000 (made by Peter Wolters AG) was used as a double side polishing apparatus. The polishing conditions were as described below.
Polishing load: 300 g/cm$^2$ (30 kPa)
Polishing cloth: SUBA 600 (a trade name of Rodel Nitta Company) (an Asker C hardness of 78)
Polishing agent: HP-20 (a trade name of Fujimi Incorporated) (pH=10.5)
Supplying rate: 5 L/min
Stock removal: polished with 81 μm for one surface (16 μm for two surfaces).

(2) Single Side (Back Side) Polishing Step

The FSP-200 (made by Fujikoshi Machinery Corp.) was used as a polishing apparatus. The polishing conditions were as described below. A wafer holding plate made of SiC ceramics having high flatness and coated with epoxy resin was used.
Polishing load: 300 g/cm$^2$ (30 kPa)
Polishing cloth: SUBA 600 (a trade name of Rodel Nitta Company) (an Asker C hardness of 78)
Polishing agent: AJ-1325 (a trade name of Nissan Chemical Industries, Ltd.) (pH=10.5)
Supplying rate: 10 L/min
Stock removal: polished with 5 μm.

(3) Single Side (Front Side) Secondary Polishing Step

The FSP-200 (made by Fujikoshi Machinery Corp.) was used as a polishing apparatus, and the polishing conditions were as described below. A urethane foam pad was used as a backing pad for holding a wafer.
Polishing load: 200 g/cm$^2$ (20 kPa)
Polishing cloth: PU pad (a trade name of Rodel Nitta Company) (an Asker C hardness of 80)
Polishing agent: SSS (a trade name of Nissan Chemical Industries, Ltd.) (pH=10.5)
Supplying rate: 10 L/min
Stock removal: about 1 μm.

(4) Final Polishing Step

The FSP-200 (made by Fujikoshi Machinery Corp.) was used as a polishing apparatus, and the polishing conditions were as described below.
Polishing load: 150 g/cm$^2$ (15 kPa)
Polishing cloth: FS-7 (a trade name of Daiichi Lace Inc.)
Polishing agent: Fujimi 3900 (a trade name of Fujimi Incorporated)
Supplying rate: 500 mL/min
Stock removal: 0.1 μm or less.

Figure 2:
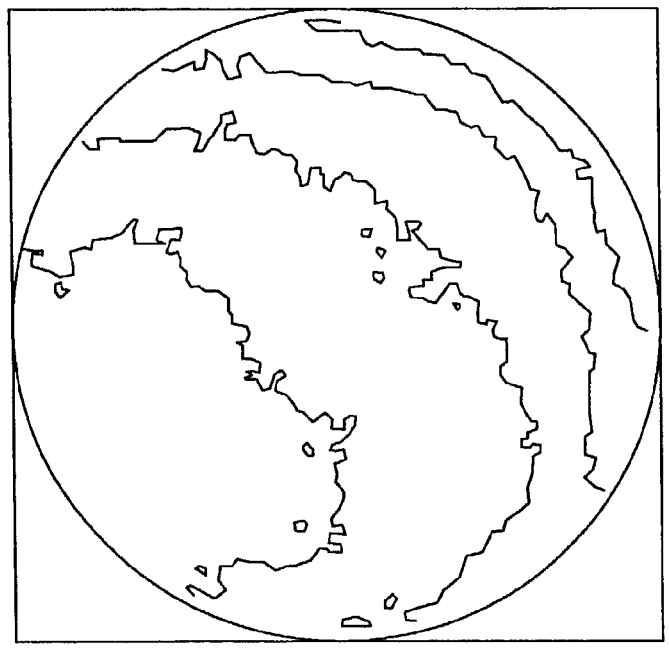
FIG. 2 is a map showing flatness of a front surface of a wafer after having been polished in Inventive Example 1.

Evaluation for flatness and nanotopology of the wafer having been subjected to the polishing steps described above was carried out. FIG. 2 is a map showing flatness of the polished wafer. This map was obtained by measuring with a thickness measurement apparatus having a capacitive sensor (7900E+ Station made by ADE Corp.). The flatness (SFQRmax) of this wafer was 0.071 μm, which was very excellent.

Figure 5:
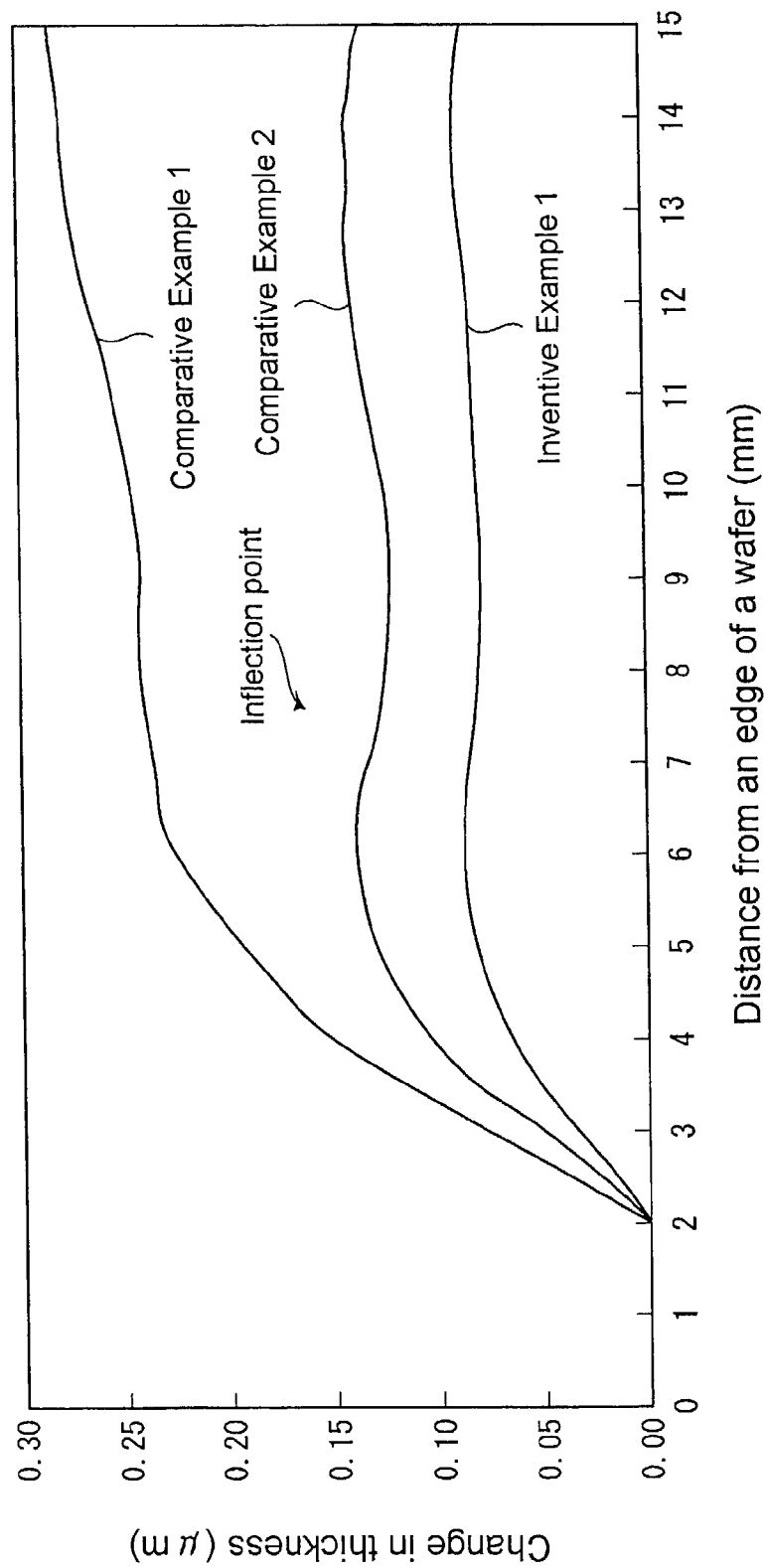
FIG. 5 is a graph showing cross-sectional shapes of peripheries of wafers (a relationship between a distance from an edge of the wafer and a change in thickness thereof) after having been polished in Inventive Example 1, Comparative Example 1, and Comparative Example 2, respectively.

FIG. 5 shows a cross-sectional shape of the periphery of the wafer. With edge exclusion of 2 mm, and a position of 2 mm from the peripheral edge is shown as the reference (zero) therein. The polished wafer had excellent quality that the peripheral sags were improved and also no inflection point was observed.

Figure 6:
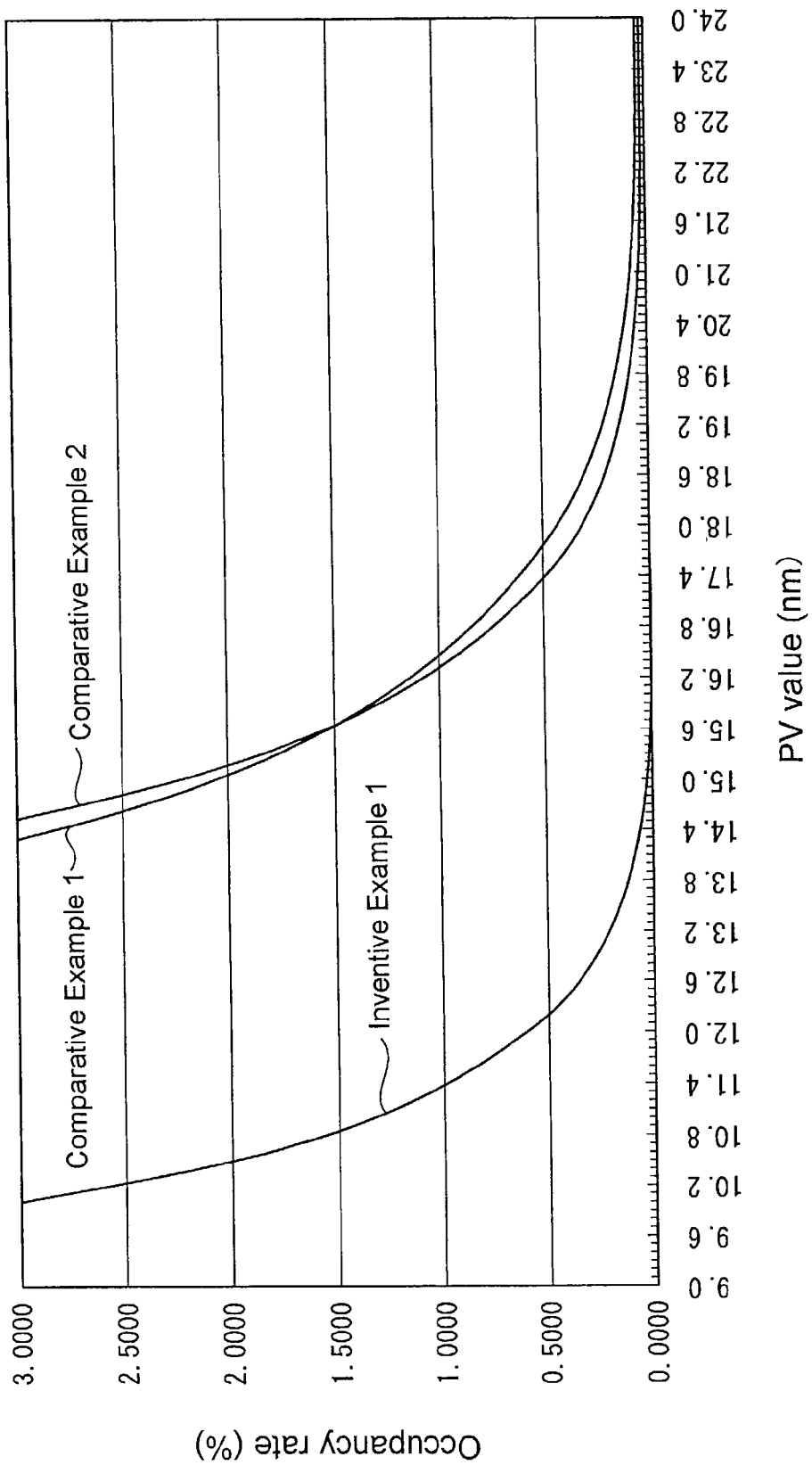
FIG. 6 is a graph showing relationships between PV values and occupancy rates of wafers having been polished in Inventive Example 1, Comparative Example 1, and Comparative Example 2, respectively.

Further the nanotopology was evaluated as shown in FIG. 6. This evaluation is based on such a manner that a wafer was divided to a plurality of areas (areas each 2 mm square), irregularities of each square were confirmed, what percent of the wafer the areas having a value for the irregularities (a PV value) occupy (occupancy rate) was checked, and the checked PV values were accumulated in a sequence of from a larger value to a smaller one. The nanotopology was evaluated with WIS CR83-SQM made by ADE Corp.

According to the graph showing the results in Inventive Example 1, the area with the PV value of 18.0 nm is almost zero, and this indicates that irregularities larger than the PV value are not present in case of the nanotopology observed on the basis of the 2 mm square area.

To be more precise, in evaluation of nanotopology, an irregularity height, at which the occupancy rate becomes zero %, (an area indicating the largest PV value) is important. In this example, the largest PV value is 18.0 nm, and this small value shows that the wafer surface includes very few irregularities (a wafer surface having excellent nanotopology).

Comparative Example 1

Figure 8:
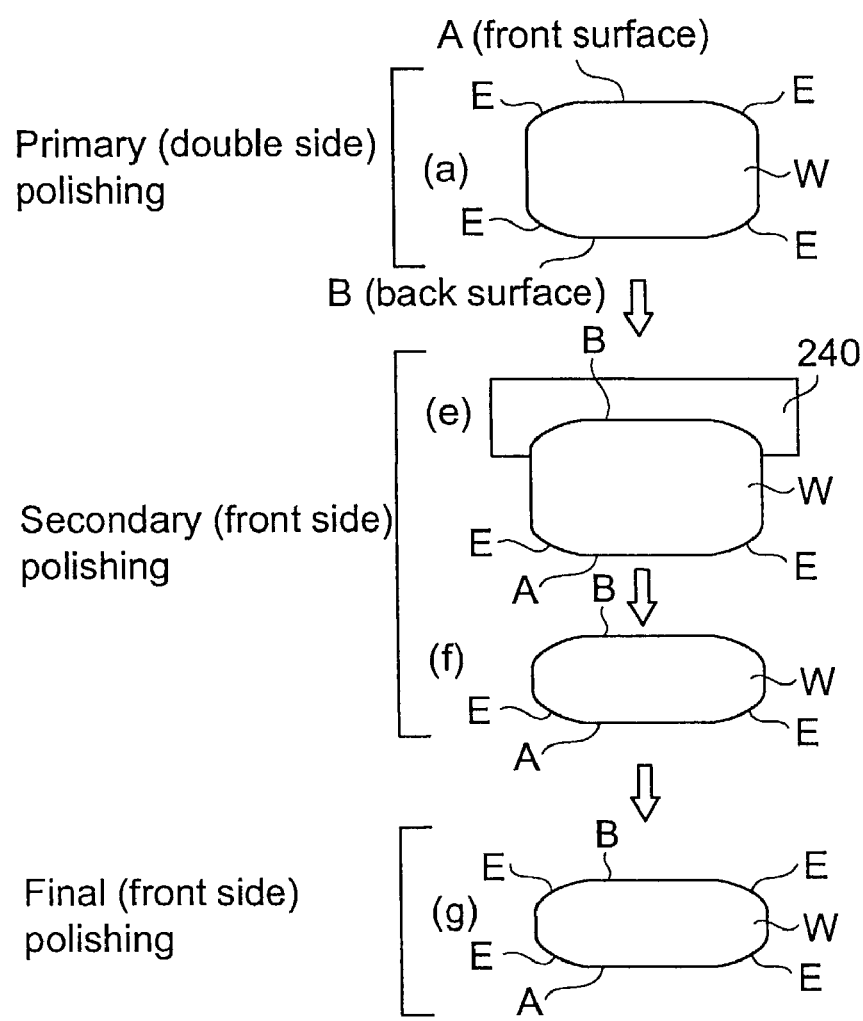
FIG. 8 is a schematic view showing a process sequence for manufacturing a wafer in Comparative Example 1.

A wafer similar to that used in Example 1 was subjected to the polishing process shown in FIG. 8, that is, the process comprising a double side (front side primary) polishing step (FIG. 8(a); the peripheral sags (E) of the wafer are large), → a single side secondary (front side secondary) polishing step (FIGS. 8(e) and 8(f); the peripheral sags (E) of the wafer become large with the flatness being not very much improved, (inflection points may be produced when a retainer ring or the like is used)), → a single side final (front side tertiary) polishing step (FIG. 8(g); the flatness in the periphery of a wafer is not very much improved). The polishing process was performed under the same conditions as those employed in Example 1 excluding the single side (back side) polishing.

After the double side polishing (FIG. 8(a)) was finished (in the stage of primary polishing), the flatness (SFQRmax) of the wafer was about 0.126 μm. The flatness was kept unchanged also after the secondary polishing was finished, and the wafer configuration was little corrected in the secondary polishing step. Rather peripheral sags were slightly generated in the secondary polishing step.

Figure 3:
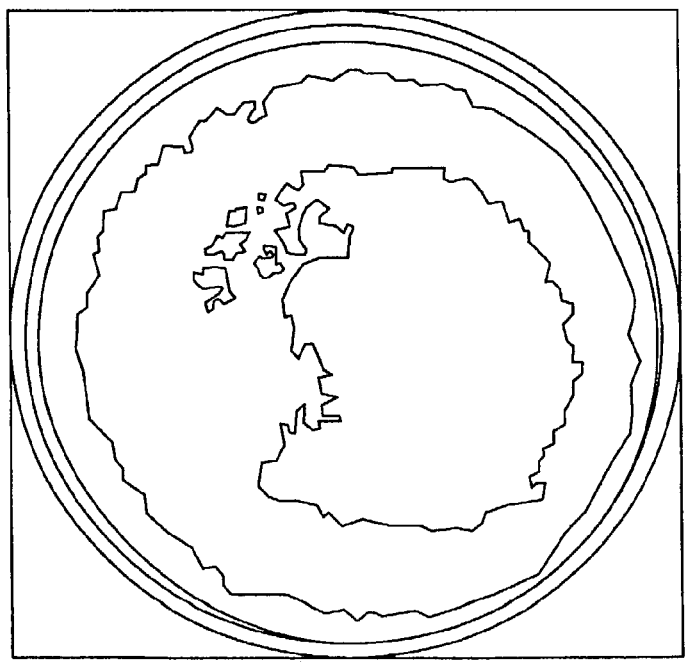
FIG. 3 is a map showing flatness of a front surface of a wafer after having been polished in Comparative Example 1.

A configuration of a wafer having been subjected to the polishing steps as described above is shown in FIG. 3. There has known therefrom the fact that contour lines are crowded in the periphery of the wafer, which indicates that there are sags in the crowded portion. There is known also from FIG. 5 the fact that the wafer configuration sharply changes in thickness of the periphery from the points of about 6 mm from the wafer edge. In short, it is a problem with the above described polishing that the flatness (especially the flatness in the periphery) of the wafer cannot be improved.

The nanotopology is shown in FIG. 6, and as shown in the graph of Comparative Example 1, the irregularity height for the occupancy rate of 0% is in the range from 30 to 40 nm, which indicates that relatively large irregularities were present on the wafer surface (wafer surface with poor nanotopology).

Comparative Example 2

Figure 9:
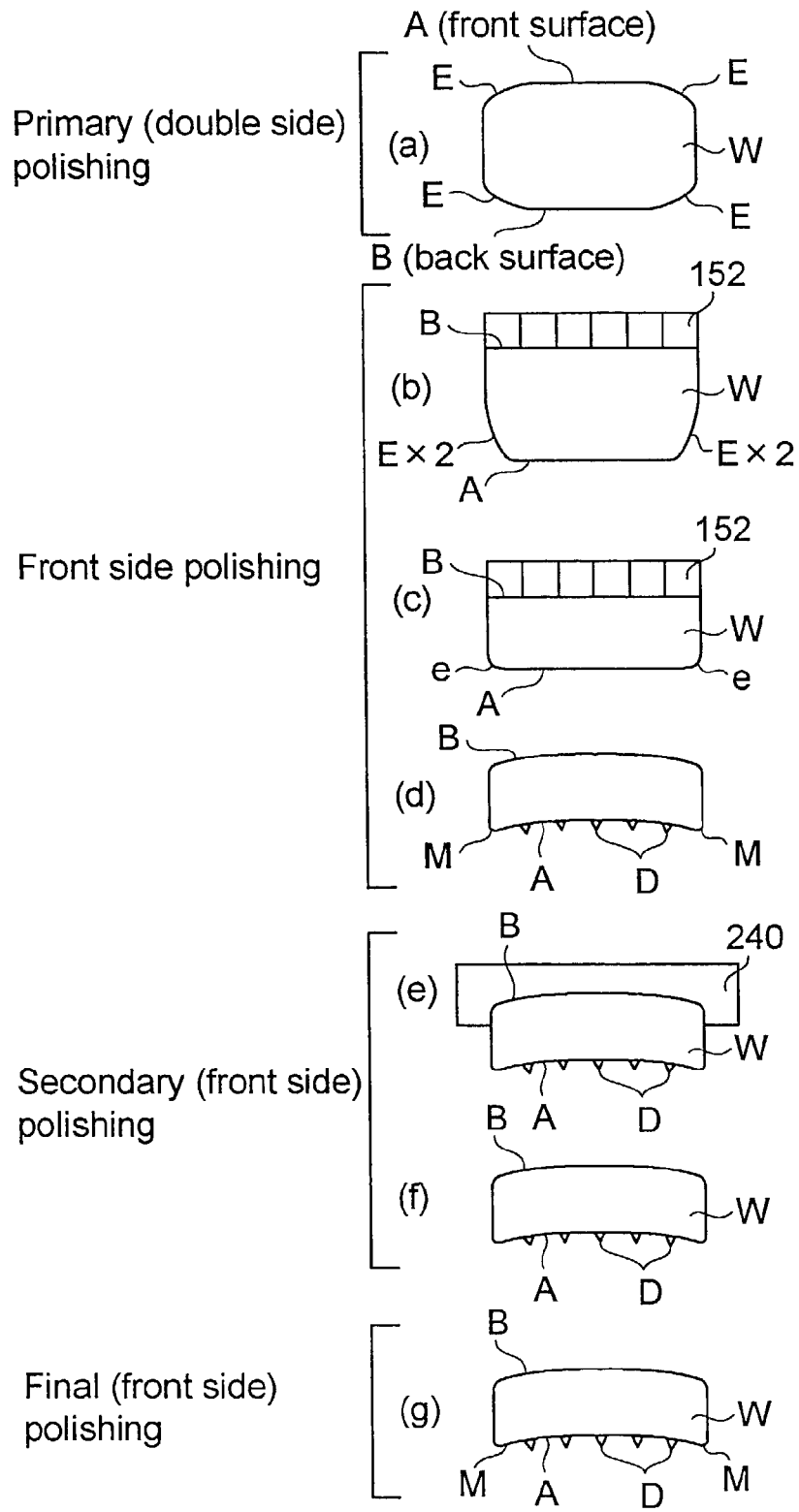
FIG. 9 is a schematic view showing a process sequence for manufacturing a wafer in Comparative Example 2.

A wafer similar to that used in Example 1 was subjected to the polishing process shown in FIG. 9, that is, the process comprising a double side (front side primary) polishing step (FIG. 9(a); peripheral sags (E) of the wafer are large), → single side (front side secondary) polishing step (FIG. 9(b); the state where the wafer is vacuum chucked (before polishing), FIG. 9(c); the state where the wafer is vacuum chucked after polishing, FIG. 9(d); the state after the wafer is released from the vacuum chucked state (the flatness of the wafer is improved, but vacuum chucking marks (D) or inflection points (M) may be generated on the surface (A)), → a single side secondary (front side tertiary) polishing step (FIG. 9(e); a front surface (A) of the wafer is polished (in the state where the configuration is maintained), FIG. 9(f), → a single side final (front side quaternary) polishing step (FIG. 9(g); the wafer has the inflection points (M) or vacuum chucking marks (D) on the front surface thereof, and the flatness and nanotopology of the front side reference are deteriorated). In brief, in this Comparative Example, in stead of the back side polishing step in Inventive Example 1, a front surface of the wafer was polished. On the same conditions as the back side polishing step in Inventive Example 1, a reference plane was produced on a surface (front surface) contrary to that in Inventive Example 1. Other conditions were the same as in Inventive Example 1.

The flatness of the wafer was improved to about 0.110 μm in terms of SFQRmax, but the improvement was not sufficient. When inspected with a magic mirror, there were some cases where marks of the throughholes were observed on the polished surface, and further the nanotopology (irregularity height for occupancy rate of 0%) was about 25 nm.

Figure 4:
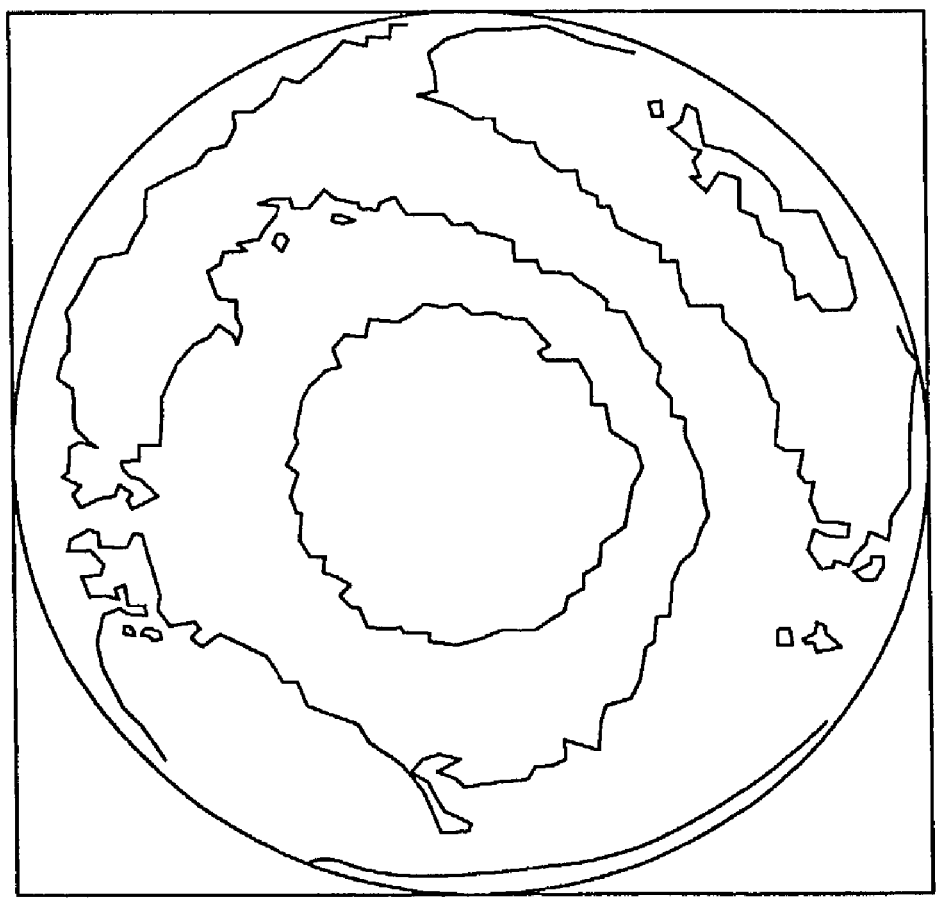
FIG. 4 is a map showing flatness of a front surface of a wafer after having been polished in Comparative Example 2.

A configuration of the wafer (map) was as shown in FIG. 4. There was sometimes observed the wafer configuration like an inflection point at a point about 6 mm from the peripheral edge thereof as shown in FIG. 5. In other words, although the flatness was improved, improvement of the nanotopology was not sufficient.

Data for the flatness (SFQR) in Inventive Example 1, Comparative Example 1, and Comparative Example 2 are shown in Table 1. SFQR for each cell within the wafer surface is 0.04 μm in all of Inventive Example 1 and Comparative Examples 1 and 2 (the value in Inventive Example 1 is a little better), but comparing the maximum value thereof, the value in Inventive Example 1 is clearly better. The evaluation was performed for cells each having a size of 25 mm×25 mm (25 mm square).

Also variations (σ) among the cells were improved, which indicates that a wafer not having inflection points or the like is manufactured. In cases of 3 mm exclusion and 2 mm exclusion, the values of the Comparative Examples deteriorate largely as compared to those of the Inventive Example. This shows in the Comparative Examples that the closer to the periphery, the larger the sags.

TABLE 1

| | SFQR (3 mm exclusion) | | | SFQR (2 mm exclusion) | | |
| --- | --- | --- | --- | --- | --- | --- |
| | Average value | σ | Max | Average value | σ | Max |
| Inventive Example 1 | 0.037 | 0.010 | 0.071 | 0.039 | 0.012 | 0.092 |
| Comparative Example 1 | 0.044 | 0.024 | 0.131 | 0.048 | 0.030 | 0.155 |
| Comparative Example 2 | 0.037 | 0.013 | 0.110 | 0.043 | 0.023 | 0.118 |

In Table 1, 3 mm exclusion means that a portion up to 3 mm from an edge of a wafer (a wafer peripheral edge) is not evaluated when the wafer flatness is evaluated, and the above value was obtained by evaluating the areas inner from the above portion. Likewise, 2 mm exclusion means that the portion up to 2 mm from the edge of the wafer (the wafer peripheral edge) is not evaluated.

In the methods employed in the Comparative Examples, SFQRmax values were at best in the range from 0.10 to 0.15 μm, and SBIRmax values were improved only up to 0.3 μm, which are not shown herein, but by adding the back side polishing as in the Inventive Example, it is possible to stably manufacture wafers with SFQRmax of 0.10 μm or less and the SBIRmax of 0.3 μm or less. Further wafers having excellent nanotopology can be manufactured easily.

Inventive Example 2

A wafer similar to that used in Inventive Example 1 was polished as in Inventive Example 1 excluding the point that polishing based on the waxless system using a template was performed in place of the double side (front side primary) polishing. To be more precise, the wafer was subjected to a polishing process comprising a front side (single side) primary polishing step based on the front side reference polishing system, a back side (single side) polishing step, → a front side (single side) secondary polishing step, → a front side (single side) final polishing step.

In Inventive Example 2, a polishing apparatus capable of successively performing front side (single side) primary polishing based on the front side reference polishing system, back side polishing, front side secondary polishing, and final polishing was used. More specifically, there was used a polishing apparatus, in which three polishing machines (three polishing sections) as shown in FIG. 13 are arranged integrally with two polishing stages being provided in each polishing section.

In each cleaning unit, there was employed a cleaning system in which using a dipping type cleaning with a SC1 liquid (a cleaning liquid mixture of ammonia, hydrogen peroxide and water), a wafer was treated in the sequence of the rinsing liquid, SC1 liquid, rinsing liquid, and rinsing liquid.

Polishing conditions in each polishing section in Inventive Example 2 were as those in Inventive Example 1 in terms of the polishing load, polishing cloth, polishing agent, supplying rate of the polishing agent, and stock removal, excluding the polishing conditions of the front side (single side) primary polishing step based on the front side reference polishing system and 8 μm of the stock removal in the back side polishing. The front side (single side) primary polishing based on the front side reference polishing system is waxless polishing based on the template system in which a urethane foam pad was used as a backing pad for holding a wafer. The polishing conditions were as described below:

Polishing load: 300 g/cm$^2$ (30 kPa)
Polishing cloth: SUBA 600 (a trade name of Rodel Nitta Company) (an Asker C hardness of 78)
Polishing agent: HP-20 (a trade name of Fujimi Incorporated) (pH=10.5)
Supplying rate: 5 L/min
Stock removal: 10 μm With the polishing apparatus and the polishing conditions as described above, the wafer was polished, and the result of the polishing showed that the flatness of the polished wafer (SFQRmax; 2 mm exclusion) was 0.10 μm. Further the irregularity height for the occupancy rate of 0% in the evaluation of nanotopology was 20 nm, which was very excellent. The SBIRmax was 0.14 μm, which was also excellent.

CAPABILITY OF EXPLOITATION IN INDUSTRY

As described above, according to the present invention, it is possible to perform control of sags in the periphery of the wafer that is the most difficult problem in the polishing techniques, and to manufacture a wafer with excellent flatness including the portion of 2 mm or less from the wafer edge, especially a wafer having no inflection point in flatness in an inner portion from 3 mm of the wafer periphery, and further a wafer with excellent nanotopology especially required in recent years, that is, a wafer with excellent flatness and nanotopology.

The invention claimed is:

1. A wafer manufacturing method comprising the steps of:
   performing primary polishing to at least the front side of a wafer,
   after performing the primary polishing step, performing reference plane producing-mirror polishing to the back side of the wafer to produce a mirror surface as a reference plane on the back side of the wafer, and
   after performing the reference plane producing-mirror polishing step, performing secondary polishing to at least the front side of the wafer,
   wherein said reference plane producing-mirror polishing of said back side removes an amount of stock of the wafer of at least 3 μm and no greater than 10 μm.

2. The wafer manufacturing method according to claim 1, further comprising the step of:
   performing final polishing of the front side of said wafer only after performing said secondary polishing,
   wherein the primary polishing is polishing the front and back side of said wafer simultaneously,
   wherein the secondary polishing is polishing the front side of said wafer only, and
   wherein the final polishing is polishing the front side of said wafer only.

3. The wafer manufacturing method according to claim 1, further comprising the step of:
   performing final polishing of the front side of said wafer only after performing said secondary polishing,
   wherein the primary polishing is polishing the front side of said wafer only,
   wherein the secondary polishing is polishing the front side of said wafer only, and
   wherein the final polishing is polishing the front side of said wafer only.

4. The wafer manufacturing method according to claim 1, wherein said mirror polishing of said back side is performed while the wafer is held by a wafer holding plate which has a hard wafer holding portion and a flat wafer holding face.

5. The wafer manufacturing method according to claim 2, wherein said mirror polishing of said back side is performed while the wafer is held by a wafer holding plate which has a hard wafer holding portion and a flat wafer holding face.

6. The wafer manufacturing method according to claim 3, wherein said mirror polishing of said back side is performed while the wafer is held by a wafer holding plate which has a hard wafer holding portion and a flat wafer holding face.

7. The wafer manufacturing method according to claim 2, wherein said secondary polishing of said front side is performed using a polishing cloth with an Asker C hardness of 70 to 90 while the wafer is held by a backing pad.

8. The wafer manufacturing method according to claim 3, wherein said secondary polishing of said front side is performed using a polishing cloth with an Asker C hardness of 70 to 90 while the wafer is held by a backing pad.

9. The wafer manufacturing method according to claim 1, wherein said secondary polishing of said front side is performed using a polishing cloth with an Asker C hardness of 70 to 90 while the wafer is held by a backing pad.

* * * * *